United States Patent
Bird et al.

(10) Patent No.: US 12,262,512 B2
(45) Date of Patent: Mar. 25, 2025

(54) SYSTEMS FOR DISSIPATING HEAT FROM VEHICLE-BASED DEVICES HAVING ELECTRONIC CIRCUITRY

(71) Applicant: Motional AD LLC, Boston, MA (US)

(72) Inventors: Christopher P. Bird, Carnegie, PA (US); Andrew Moore, Pittsburgh, PA (US)

(73) Assignee: Motional AD LLC, Boston, MA (US)

( * ) Notice: Subject to any disclaimer, the term of this patent is extended or adjusted under 35 U.S.C. 154(b) by 309 days.

(21) Appl. No.: 17/865,070

(22) Filed: Jul. 14, 2022

(65) Prior Publication Data
US 2024/0023284 A1    Jan. 18, 2024

(51) Int. Cl.
H05K 7/20       (2006.01)

(52) U.S. Cl.
CPC ..... H05K 7/20409 (2013.01); H05K 7/20145 (2013.01); H05K 7/20209 (2013.01); H05K 7/2039 (2013.01); H05K 7/20854 (2013.01); H05K 7/20863 (2013.01)

(58) Field of Classification Search
CPC ........... H05K 7/20863; H05K 7/20854; H05K 7/20409
See application file for complete search history.

(56) References Cited

U.S. PATENT DOCUMENTS

| | | | |
|---|---|---|---|
| 2011/0073289 A1 | 3/2011 | Shah | |
| 2017/0261273 A1 | 9/2017 | Maranville et al. | |
| 2021/0051821 A1* | 2/2021 | Holleczek | H05K 7/20863 |
| 2021/0063093 A1 | 3/2021 | Tobiassen et al. | |
| 2021/0068312 A1 | 3/2021 | Tobiassen et al. | |
| 2021/0103036 A1 | 4/2021 | Robertson, Jr. et al. | |

FOREIGN PATENT DOCUMENTS

JP     2017137002 A  *  8/2017

OTHER PUBLICATIONS

International Search Report and Written Opinion in International Appln. No. PCT/US2023/027660, mailed on Oct. 19, 2023, 9 pages.
[No Author Listed], "Surface Vehicle Recommended Practice: Taxonomy and Definitions for Terms Related to Driving Automation Systems for On-Road Motor Vehicles," SAE International, Standard J3016, Sep. 30, 2016, 30 pages.

* cited by examiner

*Primary Examiner* — Eric S Ruppert
(74) *Attorney, Agent, or Firm* — Fish & Richardson P.C.

(57) ABSTRACT

Provided are example systems for dissipating heat from vehicle-based data processing components. In an example implementation, a heat dissipation device includes a heat sink, an enclosure configured to receive a device including electronic circuitry, a fan, and a flange extending along a periphery of the enclosure and/or the heat sink. The heat dissipation device is configured for insertion into an aperture of a wall of an interior compartment of a vehicle, such that the flange is positioned against the wall, at least a portion of the enclosure is positioned within the interior compartment of the vehicle, and at least a portion of the heat sink and the fan are positioned along an exterior of the vehicle.

23 Claims, 16 Drawing Sheets

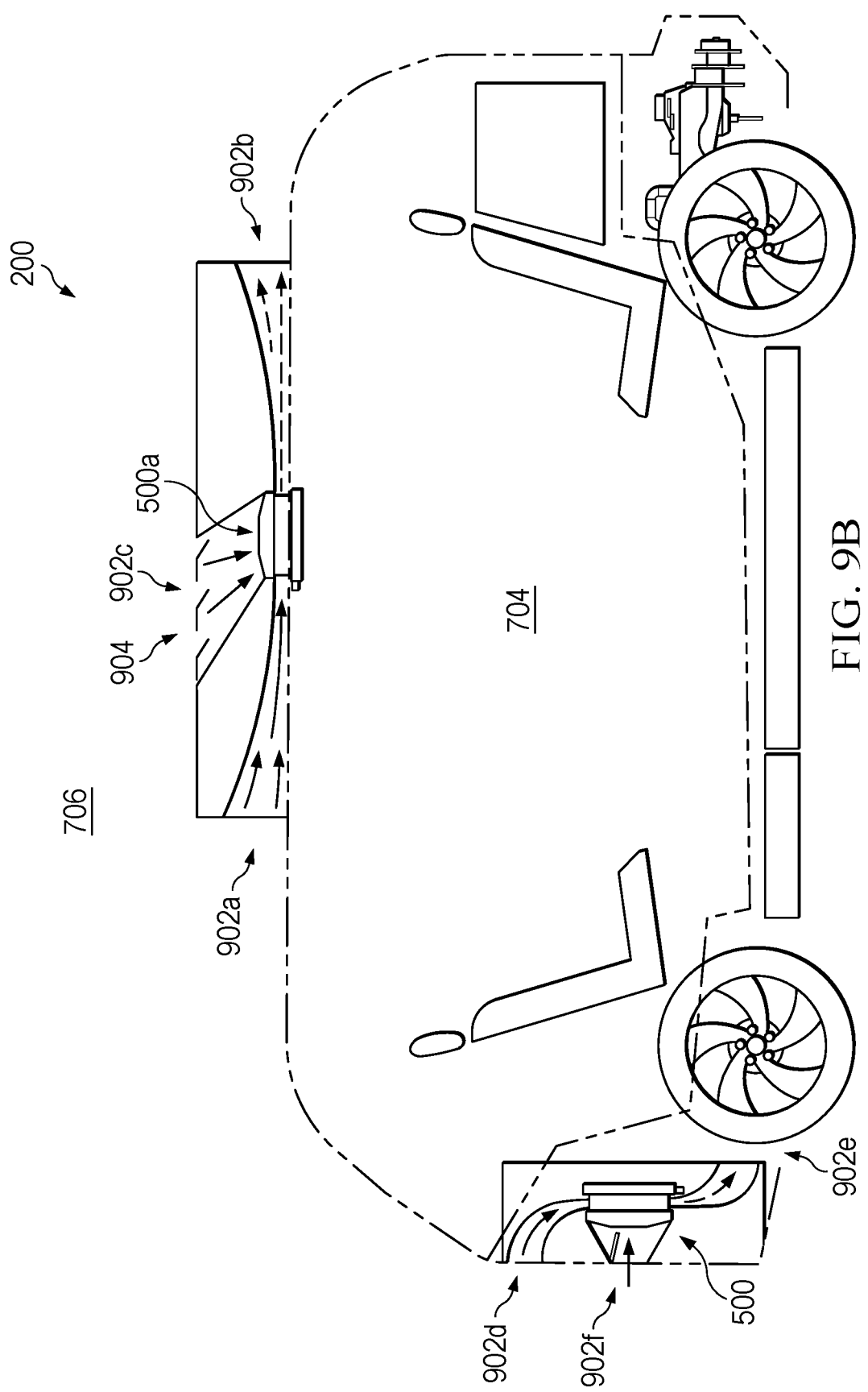

SYSTEMS FOR DISSIPATING HEAT FROM VEHICLE-BASED DEVICES HAVING ELECTRONIC CIRCUITRY

BACKGROUND

In general, vehicles can include various devices having electronic circuitry, such as computer processing units (CPUs), graphics processing units, (GPUs), etc. These devices may generate heat during operation.

BRIEF DESCRIPTION OF THE FIGURES

FIGS. 9A-9B are diagrams of example heat dissipating devices and air ducts secured to a vehicle.

DETAILED DESCRIPTION

Figure 1:
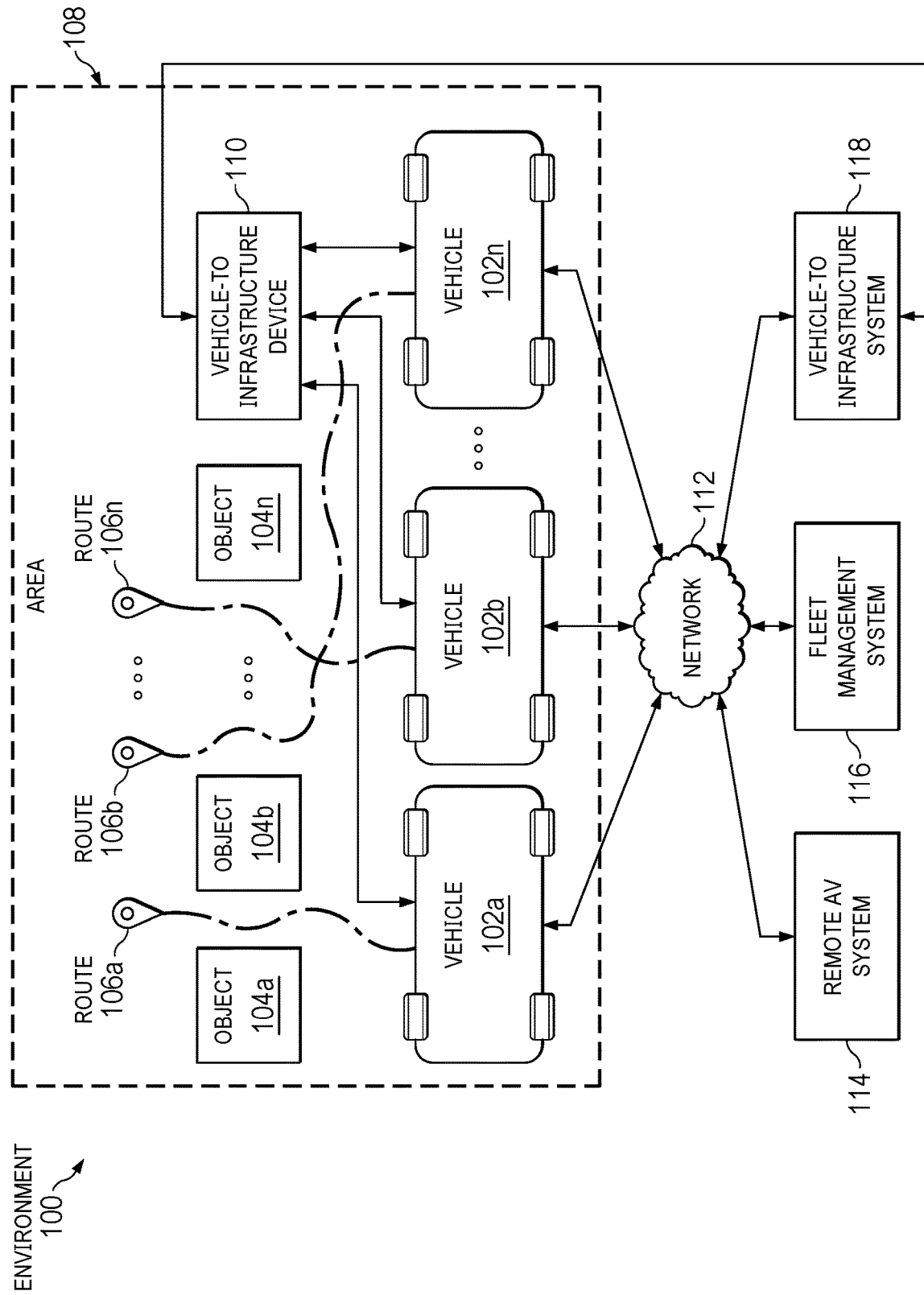
FIG. 1 is an example environment in which a vehicle including one or more components of an autonomous system can be implemented.

In the following description numerous specific details are set forth in order to provide a thorough understanding of the present disclosure for the purposes of explanation. It will be apparent, however, that the embodiments described by the present disclosure can be practiced without these specific details. In some instances, well-known structures and devices are illustrated in block diagram form in order to avoid unnecessarily obscuring aspects of the present disclosure.

Specific arrangements or orderings of schematic elements, such as those representing systems, devices, modules, instruction blocks, data elements, and/or the like are illustrated in the drawings for ease of description. However, it will be understood by those skilled in the art that the specific ordering or arrangement of the schematic elements in the drawings is not meant to imply that a particular order or sequence of processing, or separation of processes, is required unless explicitly described as such. Further, the inclusion of a schematic element in a drawing is not meant to imply that such element is required in all embodiments or that the features represented by such element may not be included in or combined with other elements in some embodiments unless explicitly described as such.

Further, where connecting elements such as solid or dashed lines or arrows are used in the drawings to illustrate a connection, relationship, or association between or among two or more other schematic elements, the absence of any such connecting elements is not meant to imply that no connection, relationship, or association can exist. In other words, some connections, relationships, or associations between elements are not illustrated in the drawings so as not to obscure the disclosure. In addition, for ease of illustration, a single connecting element can be used to represent multiple connections, relationships or associations between elements. For example, where a connecting element represents communication of signals, data, or instructions (e.g., "software instructions"), it should be understood by those skilled in the art that such element can represent one or multiple signal paths (e.g., a bus), as may be needed, to affect the communication.

Although the terms first, second, third, and/or the like are used to describe various elements, these elements should not be limited by these terms. The terms first, second, third, and/or the like are used only to distinguish one element from another. For example, a first contact could be termed a second contact and, similarly, a second contact could be termed a first contact without departing from the scope of the described embodiments. The first contact and the second contact are both contacts, but they are not the same contact.

The terminology used in the description of the various described embodiments herein is included for the purpose of describing particular embodiments only and is not intended to be limiting. As used in the description of the various described embodiments and the appended claims, the singular forms "a," "an" and "the" are intended to include the plural forms as well and can be used interchangeably with "one or more" or "at least one," unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this description specify the presence of stated features, integers, steps, operations, elements, and/or components, but do not preclude the presence or addition of one or more other features, integers, steps, operations, elements, components, and/or groups thereof.

As used herein, the terms "communication" and "communicate" refer to at least one of the reception, receipt, transmission, transfer, provision, and/or the like of information (or information represented by, for example, data, signals, messages, instructions, commands, and/or the like). For one unit (e.g., a device, a system, a component of a device or system, combinations thereof, and/or the like) to be in communication with another unit means that the one unit is able to directly or indirectly receive information from and/or send (e.g., transmit) information to the other unit. This may refer to a direct or indirect connection that is wired and/or wireless in nature. Additionally, two units may be in communication with each other even though the information transmitted may be modified, processed, relayed, and/or routed between the first and second unit. For example, a first unit may be in communication with a second unit even though the first unit passively receives information and does not actively transmit information to the second unit. As another example, a first unit may be in communication with a second unit if at least one intermediary unit (e.g., a third unit located between the first unit and the second unit) processes information received from the first unit and transmits the processed information to the second unit. In some embodiments, a message may refer to a network packet (e.g., a data packet and/or the like) that includes data.

As used herein, the term "if" is, optionally, construed to mean "when", "upon", "in response to determining," "in response to detecting," and/or the like, depending on the context. Similarly, the phrase "if it is determined" or "if [a stated condition or event] is detected" is, optionally, construed to mean "upon determining," "in response to determining," "upon detecting [the stated condition or event],"

"in response to detecting [the stated condition or event]," and/or the like, depending on the context. Also, as used herein, the terms "has", "have", "having", or the like are intended to be open-ended terms. Further, the phrase "based on" is intended to mean "based at least partially on" unless explicitly stated otherwise.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments can be practiced without these specific details. In other instances, well-known methods, procedures, components, circuits, and networks have not been described in detail so as not to unnecessarily obscure aspects of the embodiments.

General Overview

In some aspects and/or embodiments, the systems described herein dissipate heat from vehicle-based data processing components, such as data processing components installed in AVs.

In an example embodiment, a heat dissipation device includes an enclosure that receives one or more electronic devices, a heat sink, and a fan for extracting heat from the electronic devices and dissipating the heat into the surrounding environment. Further, the heat dissipation device is configured for insertion in an aperture of a wall of the vehicle's interior compartment (e.g., a wall of a passenger compartment and/or cargo compartment), such that the heat sink and the fan are positioned on the exterior of the vehicle, while the enclosure and the one or more electronic devices within the enclosure are positioned within the vehicle's interior compartment. At least in some embodiments, the heat dissipation devices enable electronic devices of the vehicle to be cooled in a more efficient and/or effective manner when compared to traditional heat dissipation techniques. Example heat dissipation devices are described in further detail with reference to FIGS. 5A-10.

Referring now to FIG. 1, illustrated is example environment 100 in which vehicles that include autonomous systems, as well as vehicles that do not, are operated. As illustrated, environment 100 includes vehicles 102a-102n, objects 104a-104n, routes 106a-106n, area 108, vehicle-to-infrastructure (V2I) device 110, network 112, remote autonomous vehicle (AV) system 114, fleet management system 116, and V2I system 118. Vehicles 102a-102n, vehicle-to-infrastructure (V2I) device 110, network 112, autonomous vehicle (AV) system 114, fleet management system 116, and V2I system 118 interconnect (e.g., establish a connection to communicate and/or the like) via wired connections, wireless connections, or a combination of wired or wireless connections. In some embodiments, objects 104a-104n interconnect with at least one of vehicles 102a-102n, vehicle-to-infrastructure (V2I) device 110, network 112, remote autonomous vehicle (AV) system 114, fleet management system 116, and V2I system 118 via wired connections, wireless connections, or a combination of wired or wireless connections.

Vehicles 102a-102n (referred to individually as vehicle 102 and collectively as vehicles 102) include at least one device configured to transport goods and/or people. In some embodiments, vehicles 102 are configured to be in communication with V2I device 110, remote AV system 114, fleet management system 116, and/or V2I system 118 via network 112. In some embodiments, vehicles 102 include cars, buses, trucks, trains, and/or the like. In some embodiments, vehicles 102 are the same as, or similar to, vehicles 200, described herein (see FIG. 2). In some embodiments, a vehicle 200 of a set of vehicles 200 is associated with an autonomous fleet manager. In some embodiments, vehicles 102 travel along respective routes 106a-106n (referred to individually as route 106 and collectively as routes 106), as described herein. In some embodiments, one or more vehicles 102 include an autonomous system (e.g., an autonomous system that is the same as or similar to autonomous system 202).

Objects 104a-104n (referred to individually as object 104 and collectively as objects 104) include, for example, at least one vehicle, at least one pedestrian, at least one cyclist, at least one structure (e.g., a building, a sign, a fire hydrant, etc.), and/or the like. Each object 104 is stationary (e.g., located at a fixed location for a period of time) or mobile (e.g., having a velocity and associated with at least one trajectory). In some embodiments, objects 104 are associated with corresponding locations in area 108.

Routes 106a-106n (referred to individually as route 106 and collectively as routes 106) are each associated with (e.g., prescribe) a sequence of actions (also known as a trajectory) connecting states along which an AV can navigate. Each route 106 starts at an initial state (e.g., a state that corresponds to a first spatiotemporal location, velocity, and/or the like) and ends at a final goal state (e.g., a state that corresponds to a second spatiotemporal location that is different from the first spatiotemporal location) or goal region (e.g. a subspace of acceptable states (e.g., terminal states)). In some embodiments, the first state includes a location at which an individual or individuals are to be picked-up by the AV and the second state or region includes a location or locations at which the individual or individuals picked-up by the AV are to be dropped-off. In some embodiments, routes 106 include a plurality of acceptable state sequences (e.g., a plurality of spatiotemporal location sequences), the plurality of state sequences associated with (e.g., defining) a plurality of trajectories. In an example, routes 106 include only high level actions or imprecise state locations, such as a series of connected roads dictating turning directions at roadway intersections. Additionally, or alternatively, routes 106 may include more precise actions or states such as, for example, specific target lanes or precise locations within the lane areas and targeted speed at those positions. In an example, routes 106 include a plurality of precise state sequences along the at least one high level action sequence with a limited lookahead horizon to reach intermediate goals, where the combination of successive iterations of limited horizon state sequences cumulatively correspond to a plurality of trajectories that collectively form the high level route to terminate at the final goal state or region.

Area 108 includes a physical area (e.g., a geographic region) within which vehicles 102 can navigate. In an example, area 108 includes at least one state (e.g., a country, a province, an individual state of a plurality of states included in a country, etc.), at least one portion of a state, at least one city, at least one portion of a city, etc. In some embodiments, area 108 includes at least one named thoroughfare (referred to herein as a "road") such as a highway, an interstate highway, a parkway, a city street, etc. Additionally, or alternatively, in some examples area 108 includes at least one unnamed road such as a driveway, a section of a parking lot, a section of a vacant and/or undeveloped lot, a dirt path, etc. In some embodiments, a road includes at least one lane (e.g., a portion of the road that can be traversed by vehicles 102). In an example, a road includes at least one lane associated with (e.g., identified based on) at least one lane marking.

Vehicle-to-Infrastructure (V2I) device 110 (sometimes referred to as a Vehicle-to-Infrastructure or Vehicle-to-Everything (V2X) device) includes at least one device configured to be in communication with vehicles 102 and/or V2I infrastructure system 118. In some embodiments, V2I device 110 is configured to be in communication with vehicles 102, remote AV system 114, fleet management system 116, and/or V2I system 118 via network 112. In some embodiments, V2I device 110 includes a radio frequency identification (RFID) device, signage, cameras (e.g., two-dimensional (2D) and/or three-dimensional (3D) cameras), lane markers, streetlights, parking meters, etc. In some embodiments, V2I device 110 is configured to communicate directly with vehicles 102. Additionally, or alternatively, in some embodiments V2I device 110 is configured to communicate with vehicles 102, remote AV system 114, and/or fleet management system 116 via V2I system 118. In some embodiments, V2I device 110 is configured to communicate with V2I system 118 via network 112.

Network 112 includes one or more wired and/or wireless networks. In an example, network 112 includes a cellular network (e.g., a long term evolution (LTE) network, a third generation (3G) network, a fourth generation (4G) network, a fifth generation (5G) network, a code division multiple access (CDMA) network, etc.), a public land mobile network (PLMN), a local area network (LAN), a wide area network (WAN), a metropolitan area network (MAN), a telephone network (e.g., the public switched telephone network (PSTN), a private network, an ad hoc network, an intranet, the Internet, a fiber optic-based network, a cloud computing network, etc., a combination of some or all of these networks, and/or the like.

Remote AV system 114 includes at least one device configured to be in communication with vehicles 102, V2I device 110, network 112, fleet management system 116, and/or V2I system 118 via network 112. In an example, remote AV system 114 includes a server, a group of servers, and/or other like devices. In some embodiments, remote AV system 114 is co-located with the fleet management system 116. In some embodiments, remote AV system 114 is involved in the installation of some or all of the components of a vehicle, including an autonomous system, an autonomous vehicle compute, software implemented by an autonomous vehicle compute, and/or the like. In some embodiments, remote AV system 114 maintains (e.g., updates and/or replaces) such components and/or software during the lifetime of the vehicle.

Fleet management system 116 includes at least one device configured to be in communication with vehicles 102, V2I device 110, remote AV system 114, and/or V2I infrastructure system 118. In an example, fleet management system 116 includes a server, a group of servers, and/or other like devices. In some embodiments, fleet management system 116 is associated with a ridesharing company (e.g., an organization that controls operation of multiple vehicles (e.g., vehicles that include autonomous systems and/or vehicles that do not include autonomous systems) and/or the like).

In some embodiments, V2I system 118 includes at least one device configured to be in communication with vehicles 102, V2I device 110, remote AV system 114, and/or fleet management system 116 via network 112. In some examples, V2I system 118 is configured to be in communication with V2I device 110 via a connection different from network 112. In some embodiments, V2I system 118 includes a server, a group of servers, and/or other like devices. In some embodiments, V2I system 118 is associated with a municipality or a private institution (e.g., a private institution that maintains V2I device 110 and/or the like).

The number and arrangement of elements illustrated in FIG. 1 are provided as an example. There can be additional elements, fewer elements, different elements, and/or differently arranged elements, than those illustrated in FIG. 1. Additionally, or alternatively, at least one element of environment 100 can perform one or more functions described as being performed by at least one different element of FIG. 1. Additionally, or alternatively, at least one set of elements of environment 100 can perform one or more functions described as being performed by at least one different set of elements of environment 100.

Figure 2:
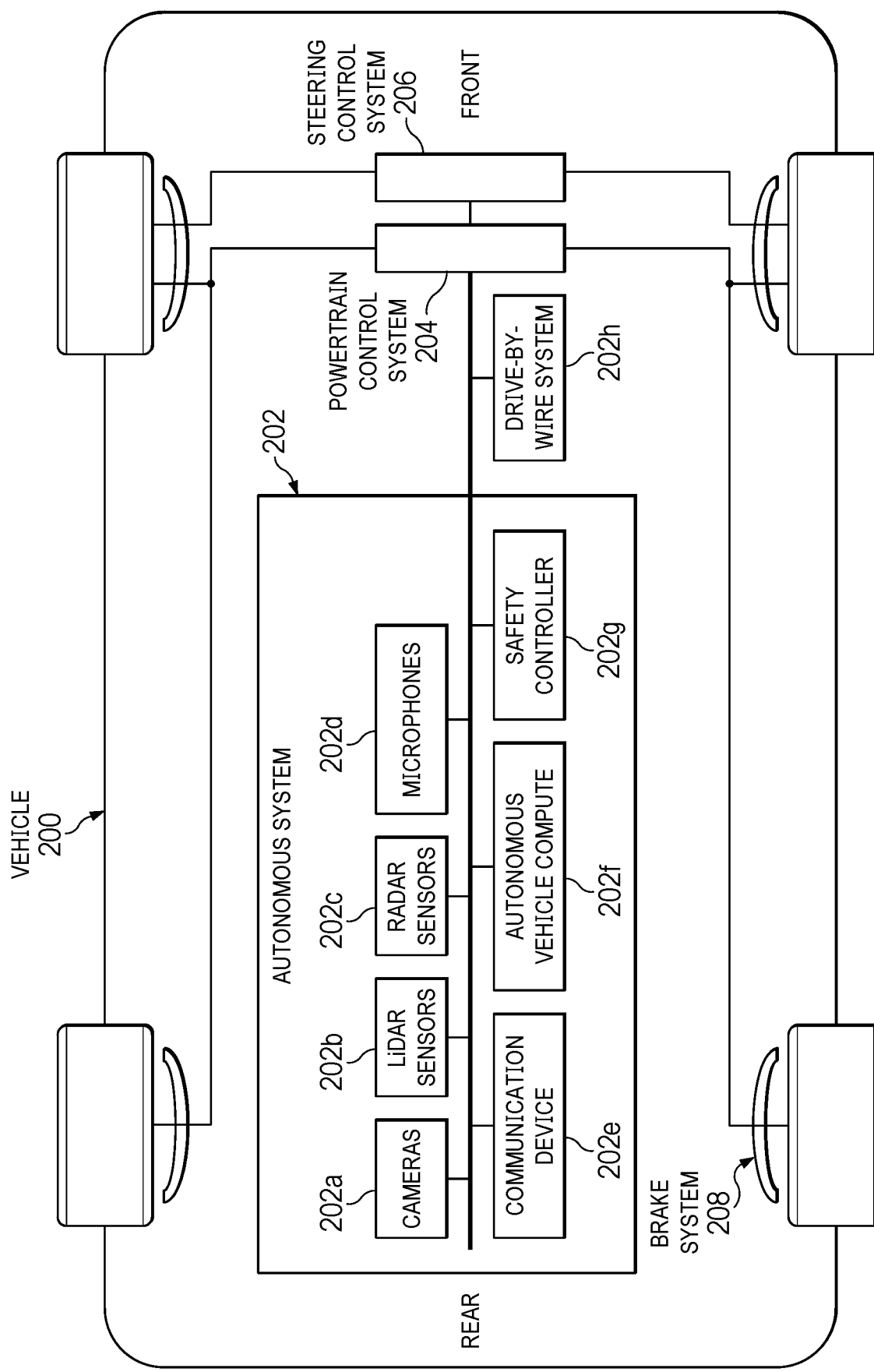
FIG. 2 is a diagram of one or more systems of a vehicle including an autonomous system.

Referring now to FIG. 2, vehicle 200 (which may be the same as, or similar to vehicles 102 of FIG. 1) includes or is associated with autonomous system 202, powertrain control system 204, steering control system 206, and brake system 208. In some embodiments, vehicle 200 is the same as or similar to vehicle 102 (see FIG. 1). In some embodiments, autonomous system 202 is configured to confer vehicle 200 autonomous driving capability (e.g., implement at least one drive automation or maneuver-based function, feature, device, and/or the like that enable vehicle 200 to be partially or fully operated without human intervention including, without limitation, fully autonomous vehicles (e.g., vehicles that forego reliance on human intervention such as Level 5 ADS-operated vehicles), highly autonomous vehicles (e.g., vehicles that forego reliance on human intervention in certain situations such as Level 4 ADS-operated vehicles), conditional autonomous vehicles (e.g., vehicles that forego reliance on human intervention in limited situations such as Level 3 ADS-operated vehicles) and/or the like.

In one embodiment, autonomous system 202 includes operational or tactical functionality required to operate vehicle 200 in on-road traffic and perform part or all of Dynamic Driving Task (DDT) on a sustained basis. In another embodiment, autonomous system 202 includes an Advanced Driver Assistance System (ADAS) that includes driver support features. Autonomous system 202 supports various levels of driving automation, ranging from no driving automation (e.g., Level 0) to full driving automation (e.g., Level 5). For a detailed description of fully autonomous vehicles and highly autonomous vehicles, reference may be made to SAE International's standard J3016: Taxonomy and Definitions for Terms Related to On-Road Motor Vehicle Automated Driving Systems, which is incorporated by reference in its entirety. In some embodiments, vehicle 200 is associated with an autonomous fleet manager and/or a ridesharing company.

Autonomous system 202 includes a sensor suite that includes one or more devices such as cameras 202a, LiDAR sensors 202b, radar sensors 202c, and microphones 202d. In some embodiments, autonomous system 202 can include more or fewer devices and/or different devices (e.g., ultrasonic sensors, inertial sensors, GPS receivers (discussed below), odometry sensors that generate data associated with an indication of a distance that vehicle 200 has traveled, and/or the like). In some embodiments, autonomous system 202 uses the one or more devices included in autonomous system 202 to generate data associated with environment 100, described herein. The data generated by the one or more devices of autonomous system 202 can be used by one or more systems described herein to observe the environment (e.g., environment 100) in which vehicle 200 is located. In some embodiments, autonomous system 202 includes communication device 202*e*, autonomous vehicle compute 202*f*, drive-by-wire (DBW) system 202*h*, and safety controller 202*g*.

Figure 3:
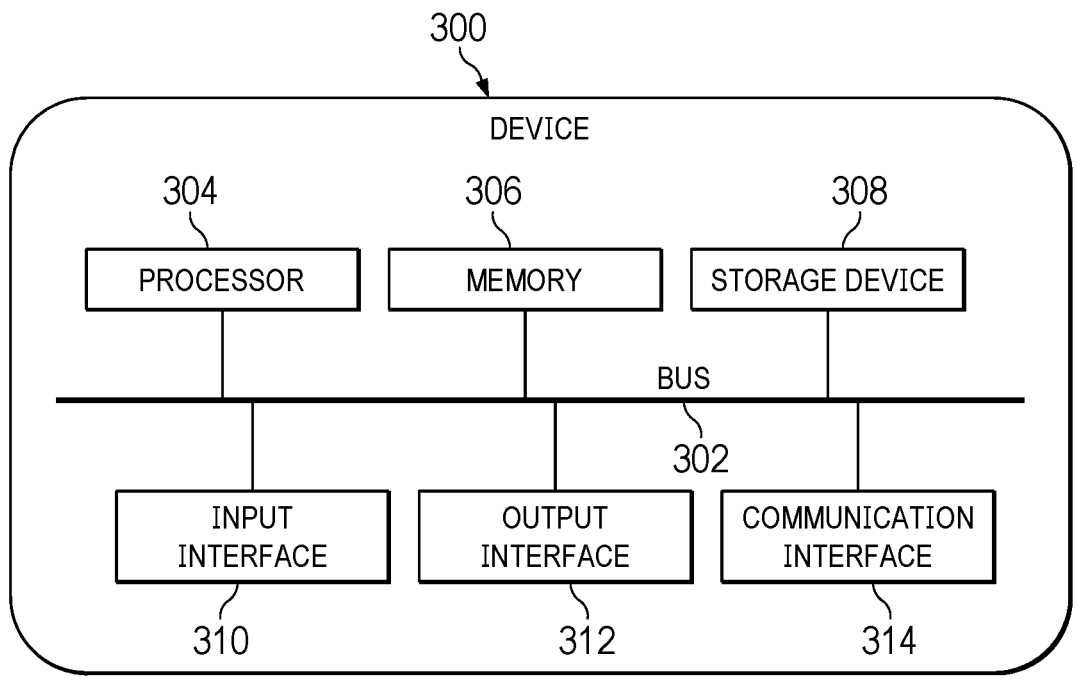
FIG. 3 is a diagram of components of one or more devices and/or one or more systems of FIGS. 1 and 2.

Cameras 202*a* include at least one device configured to be in communication with communication device 202*e*, autonomous vehicle compute 202*f*, and/or safety controller 202*g* via a bus (e.g., a bus that is the same as or similar to bus 302 of FIG. 3). Cameras 202*a* include at least one camera (e.g., a digital camera using a light sensor such as a Charge-Coupled Device (CCD), a thermal camera, an infra-red (IR) camera, an event camera, and/or the like) to capture images including physical objects (e.g., cars, buses, curbs, people, and/or the like). In some embodiments, camera 202*a* generates camera data as output. In some examples, camera 202*a* generates camera data that includes image data associated with an image. In this example, the image data may specify at least one parameter (e.g., image characteristics such as exposure, brightness, etc., an image timestamp, and/or the like) corresponding to the image. In such an example, the image may be in a format (e.g., RAW, JPEG, PNG, and/or the like). In some embodiments, camera 202*a* includes a plurality of independent cameras configured on (e.g., positioned on) a vehicle to capture images for the purpose of stereopsis (stereo vision). In some examples, camera 202*a* includes a plurality of cameras that generate image data and transmit the image data to autonomous vehicle compute 202*f* and/or a fleet management system (e.g., a fleet management system that is the same as or similar to fleet management system 116 of FIG. 1). In such an example, autonomous vehicle compute 202*f* determines depth to one or more objects in a field of view of at least two cameras of the plurality of cameras based on the image data from the at least two cameras. In some embodiments, cameras 202*a* is configured to capture images of objects within a distance from cameras 202*a* (e.g., up to 100 meters, up to a kilometer, and/or the like). Accordingly, cameras 202*a* include features such as sensors and lenses that are optimized for perceiving objects that are at one or more distances from cameras 202*a*.

In an embodiment, camera 202*a* includes at least one camera configured to capture one or more images associated with one or more traffic lights, street signs and/or other physical objects that provide visual navigation information. In some embodiments, camera 202*a* generates traffic light data associated with one or more images. In some examples, camera 202*a* generates TLD (Traffic Light Detection) data associated with one or more images that include a format (e.g., RAW, JPEG, PNG, and/or the like). In some embodiments, camera 202*a* that generates TLD data differs from other systems described herein incorporating cameras in that camera 202*a* can include one or more cameras with a wide field of view (e.g., a wide-angle lens, a fish-eye lens, a lens having a viewing angle of approximately 120 degrees or more, and/or the like) to generate images about as many physical objects as possible.

Light Detection and Ranging (LiDAR) sensors 202*b* include at least one device configured to be in communication with communication device 202*e*, autonomous vehicle compute 202*f*, and/or safety controller 202*g* via a bus (e.g., a bus that is the same as or similar to bus 302 of FIG. 3). LiDAR sensors 202*b* include a system configured to transmit light from a light emitter (e.g., a laser transmitter). Light emitted by LiDAR sensors 202*b* include light (e.g., infrared light and/or the like) that is outside of the visible spectrum. In some embodiments, during operation, light emitted by LiDAR sensors 202*b* encounters a physical object (e.g., a vehicle) and is reflected back to LiDAR sensors 202*b*. In some embodiments, the light emitted by LiDAR sensors 202*b* does not penetrate the physical objects that the light encounters. LiDAR sensors 202*b* also include at least one light detector which detects the light that was emitted from the light emitter after the light encounters a physical object. In some embodiments, at least one data processing system associated with LiDAR sensors 202*b* generates an image (e.g., a point cloud, a combined point cloud, and/or the like) representing the objects included in a field of view of LiDAR sensors 202*b*. In some examples, the at least one data processing system associated with LiDAR sensor 202*b* generates an image that represents the boundaries of a physical object, the surfaces (e.g., the topology of the surfaces) of the physical object, and/or the like. In such an example, the image is used to determine the boundaries of physical objects in the field of view of LiDAR sensors 202*b*.

Radio Detection and Ranging (radar) sensors 202*c* include at least one device configured to be in communication with communication device 202*e*, autonomous vehicle compute 202*f*, and/or safety controller 202*g* via a bus (e.g., a bus that is the same as or similar to bus 302 of FIG. 3). Radar sensors 202*c* include a system configured to transmit radio waves (either pulsed or continuously). The radio waves transmitted by radar sensors 202*c* include radio waves that are within a predetermined spectrum. In some embodiments, during operation, radio waves transmitted by radar sensors 202*c* encounter a physical object and are reflected back to radar sensors 202*c*. In some embodiments, the radio waves transmitted by radar sensors 202*c* are not reflected by some objects. In some embodiments, at least one data processing system associated with radar sensors 202*c* generates signals representing the objects included in a field of view of radar sensors 202*c*. For example, the at least one data processing system associated with radar sensor 202*c* generates an image that represents the boundaries of a physical object, the surfaces (e.g., the topology of the surfaces) of the physical object, and/or the like. In some examples, the image is used to determine the boundaries of physical objects in the field of view of radar sensors 202*c*.

Microphones 202*d* includes at least one device configured to be in communication with communication device 202*e*, autonomous vehicle compute 202*f*, and/or safety controller 202*g* via a bus (e.g., a bus that is the same as or similar to bus 302 of FIG. 3). Microphones 202*d* include one or more microphones (e.g., array microphones, external microphones, and/or the like) that capture audio signals and generate data associated with (e.g., representing) the audio signals. In some examples, microphones 202*d* include transducer devices and/or like devices. In some embodiments, one or more systems described herein can receive the data generated by microphones 202*d* and determine a position of an object relative to vehicle 200 (e.g., a distance and/or the like) based on the audio signals associated with the data.

Communication device 202*e* includes at least one device configured to be in communication with cameras 202*a*, LiDAR sensors 202*b*, radar sensors 202*c*, microphones 202*d*, autonomous vehicle compute 202*f*, safety controller 202*g*, and/or DBW (Drive-By-Wire) system 202*h*. For example, communication device 202*e* may include a device that is the same as or similar to communication interface 314 of FIG. 3. In some embodiments, communication device 202*e* includes a vehicle-to-vehicle (V2V) communication device (e.g., a device that enables wireless communication of data between vehicles).

Autonomous vehicle compute 202*f* include at least one device configured to be in communication with cameras 202*a*, LiDAR sensors 202*b*, radar sensors 202*c*, microphones 202d, communication device 202e, safety controller 202g, and/or DBW system 202h. In some examples, autonomous vehicle compute 202f includes a device such as a client device, a mobile device (e.g., a cellular telephone, a tablet, and/or the like), a server (e.g., a computing device including one or more central processing units, graphical processing units, and/or the like), and/or the like. In some embodiments, autonomous vehicle compute 202f is the same as or similar to autonomous vehicle compute 400, described herein. Additionally, or alternatively, in some embodiments autonomous vehicle compute 202f is configured to be in communication with an autonomous vehicle system (e.g., an autonomous vehicle system that is the same as or similar to remote AV system 114 of FIG. 1), a fleet management system (e.g., a fleet management system that is the same as or similar to fleet management system 116 of FIG. 1), a V2I device (e.g., a V2I device that is the same as or similar to V2I device 110 of FIG. 1), and/or a V2I system (e.g., a V2I system that is the same as or similar to V2I system 118 of FIG. 1).

Safety controller 202g includes at least one device configured to be in communication with cameras 202a, LiDAR sensors 202b, radar sensors 202c, microphones 202d, communication device 202e, autonomous vehicle computer 202f, and/or DBW system 202h. In some examples, safety controller 202g includes one or more controllers (electrical controllers, electromechanical controllers, and/or the like) that are configured to generate and/or transmit control signals to operate one or more devices of vehicle 200 (e.g., powertrain control system 204, steering control system 206, brake system 208, and/or the like). In some embodiments, safety controller 202g is configured to generate control signals that take precedence over (e.g., overrides) control signals generated and/or transmitted by autonomous vehicle compute 202f.

DBW system 202h includes at least one device configured to be in communication with communication device 202e and/or autonomous vehicle compute 202f. In some examples, DBW system 202h includes one or more controllers (e.g., electrical controllers, electromechanical controllers, and/or the like) that are configured to generate and/or transmit control signals to operate one or more devices of vehicle 200 (e.g., powertrain control system 204, steering control system 206, brake system 208, and/or the like). Additionally, or alternatively, the one or more controllers of DBW system 202h are configured to generate and/or transmit control signals to operate at least one different device (e.g., a turn signal, headlights, door locks, windshield wipers, and/or the like) of vehicle 200.

Powertrain control system 204 includes at least one device configured to be in communication with DBW system 202h. In some examples, powertrain control system 204 includes at least one controller, actuator, and/or the like. In some embodiments, powertrain control system 204 receives control signals from DBW system 202h and powertrain control system 204 causes vehicle 200 to make longitudinal vehicle motion, such as start moving forward, stop moving forward, start moving backward, stop moving backward, accelerate in a direction, decelerate in a direction or to make lateral vehicle motion such as performing a left turn, performing a right turn, and/or the like. In an example, powertrain control system 204 causes the energy (e.g., fuel, electricity, and/or the like) provided to a motor of the vehicle to increase, remain the same, or decrease, thereby causing at least one wheel of vehicle 200 to rotate or not rotate.

Steering control system 206 includes at least one device configured to rotate one or more wheels of vehicle 200. In some examples, steering control system 206 includes at least one controller, actuator, and/or the like. In some embodiments, steering control system 206 causes the front two wheels and/or the rear two wheels of vehicle 200 to rotate to the left or right to cause vehicle 200 to turn to the left or right. In other words, steering control system 206 causes activities necessary for the regulation of the y-axis component of vehicle motion.

Brake system 208 includes at least one device configured to actuate one or more brakes to cause vehicle 200 to reduce speed and/or remain stationary. In some examples, brake system 208 includes at least one controller and/or actuator that is configured to cause one or more calipers associated with one or more wheels of vehicle 200 to close on a corresponding rotor of vehicle 200. Additionally, or alternatively, in some examples brake system 208 includes an automatic emergency braking (AEB) system, a regenerative braking system, and/or the like.

In some embodiments, vehicle 200 includes at least one platform sensor (not explicitly illustrated) that measures or infers properties of a state or a condition of vehicle 200. In some examples, vehicle 200 includes platform sensors such as a global positioning system (GPS) receiver, an inertial measurement unit (IMU), a wheel speed sensor, a wheel brake pressure sensor, a wheel torque sensor, an engine torque sensor, a steering angle sensor, and/or the like. Although brake system 208 is illustrated to be located in the near side of vehicle 200 in FIG. 2, brake system 208 may be located anywhere in vehicle 200.

Referring now to FIG. 3, illustrated is a schematic diagram of a device 300. As illustrated, device 300 includes processor 304, memory 306, storage component 308, input interface 310, output interface 312, communication interface 314, and bus 302. In some embodiments, device 300 corresponds to at least one device of vehicles 102 (e.g., at least one device of a system of vehicles 102), at least one device of vehicle 200 (e.g., at least one device of a system of vehicle 200), and/or one or more devices of network 112 (e.g., one or more devices of a system of network 112). In some embodiments, one or more devices of vehicles 102 (e.g., one or more devices of a system of vehicles 102), one or more devices of vehicle 200 (e.g., one or more devices of a system of vehicle 200), and/or one or more devices of network 112 (e.g., one or more devices of a system of network 112) include at least one device 300 and/or at least one component of device 300. As shown in FIG. 3, device 300 includes bus 302, processor 304, memory 306, storage component 308, input interface 310, output interface 312, and communication interface 314.

Bus 302 includes a component that permits communication among the components of device 300. In some cases, a processor 304 includes a processor (e.g., a central processing unit (CPU), a graphics processing unit (GPU), an accelerated processing unit (APU), and/or the like), a microphone, a digital signal processor (DSP), and/or any processing component (e.g., a field-programmable gate array (FPGA), an application specific integrated circuit (ASIC), and/or the like) that can be programmed to perform at least one function. Memory 306 includes random access memory (RAM), read-only memory (ROM), and/or another type of dynamic and/or static storage device (e.g., flash memory, magnetic memory, optical memory, and/or the like) that stores data and/or instructions for use by processor 304.

Storage component 308 stores data and/or software related to the operation and use of device 300. In some examples, storage component 308 includes a hard disk (e.g., a magnetic disk, an optical disk, a magneto-optic disk, a solid state disk, and/or the like), a compact disc (CD), a digital versatile disc (DVD), a floppy disk, a cartridge, a magnetic tape, a CD-ROM, RAM, PROM, EPROM, FLASH-EPROM, NV-RAM, and/or another type of computer readable medium, along with a corresponding drive.

Input interface 310 includes a component that permits device 300 to receive information, such as via user input (e.g., a touchscreen display, a keyboard, a keypad, a mouse, a button, a switch, a microphone, a camera, and/or the like). Additionally or alternatively, in some embodiments input interface 310 includes a sensor that senses information (e.g., a global positioning system (GPS) receiver, an accelerometer, a gyroscope, an actuator, and/or the like). Output interface 312 includes a component that provides output information from device 300 (e.g., a display, a speaker, one or more light-emitting diodes (LEDs), and/or the like).

In some embodiments, communication interface 314 includes a transceiver-like component (e.g., a transceiver, a separate receiver and transmitter, and/or the like) that permits device 300 to communicate with other devices via a wired connection, a wireless connection, or a combination of wired and wireless connections. In some examples, communication interface 314 permits device 300 to receive information from another device and/or provide information to another device. In some examples, communication interface 314 includes an Ethernet interface, an optical interface, a coaxial interface, an infrared interface, a radio frequency (RF) interface, a universal serial bus (USB) interface, a WiFi® interface, a cellular network interface, and/or the like.

In some embodiments, device 300 performs one or more processes described herein. Device 300 performs these processes based on processor 304 executing software instructions stored by a computer-readable medium, such as memory 305 and/or storage component 308. A computer-readable medium (e.g., a non-transitory computer readable medium) is defined herein as a non-transitory memory device. A non-transitory memory device includes memory space located inside a single physical storage device or memory space spread across multiple physical storage devices.

In some embodiments, software instructions are read into memory 306 and/or storage component 308 from another computer-readable medium or from another device via communication interface 314. When executed, software instructions stored in memory 306 and/or storage component 308 cause processor 304 to perform one or more processes described herein. Additionally or alternatively, hardwired circuitry is used in place of or in combination with software instructions to perform one or more processes described herein. Thus, embodiments described herein are not limited to any specific combination of hardware circuitry and software unless explicitly stated otherwise.

Memory 306 and/or storage component 308 includes data storage or at least one data structure (e.g., a database and/or the like). Device 300 is capable of receiving information from, storing information in, communicating information to, or searching information stored in the data storage or the at least one data structure in memory 306 or storage component 308. In some examples, the information includes network data, input data, output data, or any combination thereof.

In some embodiments, device 300 is configured to execute software instructions that are either stored in memory 306 and/or in the memory of another device (e.g., another device that is the same as or similar to device 300). As used herein, the term "module" refers to at least one instruction stored in memory 306 and/or in the memory of another device that, when executed by processor 304 and/or by a processor of another device (e.g., another device that is the same as or similar to device 300) cause device 300 (e.g., at least one component of device 300) to perform one or more processes described herein. In some embodiments, a module is implemented in software, firmware, hardware, and/or the like.

The number and arrangement of components illustrated in FIG. 3 are provided as an example. In some embodiments, device 300 can include additional components, fewer components, different components, or differently arranged components than those illustrated in FIG. 3. Additionally or alternatively, a set of components (e.g., one or more components) of device 300 can perform one or more functions described as being performed by another component or another set of components of device 300.

Figure 4:
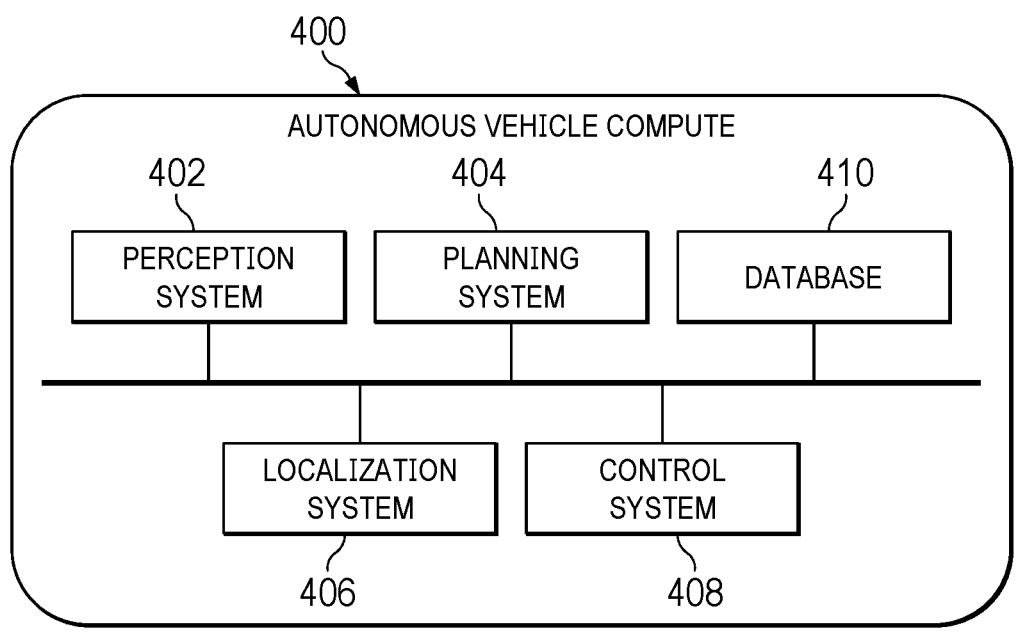
FIG. 4 is a diagram of certain components of an autonomous system.

Referring now to FIG. 4, illustrated is an example block diagram of an autonomous vehicle compute 400 (sometimes referred to as an "AV stack"). As illustrated, autonomous vehicle compute 400 includes perception system 402 (sometimes referred to as a perception module), planning system 404 (sometimes referred to as a planning module), localization system 406 (sometimes referred to as a localization module), control system 408 (sometimes referred to as a control module), and database 410. In some embodiments, perception system 402, planning system 404, localization system 406, control system 408, and database 410 are included and/or implemented in an autonomous navigation system of a vehicle (e.g., autonomous vehicle compute 202f of vehicle 200). Additionally, or alternatively, in some embodiments perception system 402, planning system 404, localization system 406, control system 408, and database 410 are included in one or more standalone systems (e.g., one or more systems that are the same as or similar to autonomous vehicle compute 400 and/or the like). In some examples, perception system 402, planning system 404, localization system 406, control system 408, and database 410 are included in one or more standalone systems that are located in a vehicle and/or at least one remote system as described herein. In some embodiments, any and/or all of the systems included in autonomous vehicle compute 400 are implemented in software (e.g., in software instructions stored in memory), computer hardware (e.g., by microprocessors, microcontrollers, application-specific integrated circuits (ASICs), Field Programmable Gate Arrays (FPGAs), Arithmetic-Logic Units (ALUs), Systems on a Chip (SOCs), and/or the like), or combinations of computer software and computer hardware. It will also be understood that, in some embodiments, autonomous vehicle compute 400 is configured to be in communication with a remote system (e.g., an autonomous vehicle system that is the same as or similar to remote AV system 114, a fleet management system 116 that is the same as or similar to fleet management system 116, a V2I system that is the same as or similar to V2I system 118, and/or the like).

In some embodiments, perception system 402 receives data associated with at least one physical object (e.g., data that is used by perception system 402 to detect the at least one physical object) in an environment and classifies the at least one physical object. In some examples, perception system 402 receives image data captured by at least one camera (e.g., cameras 202a), the image associated with (e.g., representing) one or more physical objects within a field of view of the at least one camera. In such an example, perception system 402 classifies at least one physical object based on one or more groupings of physical objects (e.g., bicycles, vehicles, traffic signs, pedestrians, and/or the like).

In some embodiments, perception system 402 transmits data associated with the classification of the physical objects to planning system 404 based on perception system 402 classifying the physical objects.

In some embodiments, planning system 404 receives data associated with a destination and generates data associated with at least one route (e.g., routes 106) along which a vehicle (e.g., vehicles 102) can travel along toward a destination. In some embodiments, planning system 404 periodically or continuously receives data from perception system 402 (e.g., data associated with the classification of physical objects, described above) and planning system 404 updates the at least one trajectory or generates at least one different trajectory based on the data generated by perception system 402. In other words, planning system 404 may perform tactical function-related tasks that are required to operate vehicle 102 in on-road traffic. Tactical efforts involve maneuvering the vehicle in traffic during a trip, including but not limited to deciding whether and when to overtake another vehicle, change lanes, or selecting an appropriate speed, acceleration, deceleration, etc. In some embodiments, planning system 404 receives data associated with an updated position of a vehicle (e.g., vehicles 102) from localization system 406 and planning system 404 updates the at least one trajectory or generates at least one different trajectory based on the data generated by localization system 406.

In some embodiments, localization system 406 receives data associated with (e.g., representing) a location of a vehicle (e.g., vehicles 102) in an area. In some examples, localization system 406 receives LiDAR data associated with at least one point cloud generated by at least one LiDAR sensor (e.g., LiDAR sensors 202b). In certain examples, localization system 406 receives data associated with at least one point cloud from multiple LiDAR sensors and localization system 406 generates a combined point cloud based on each of the point clouds. In these examples, localization system 406 compares the at least one point cloud or the combined point cloud to two-dimensional (2D) and/or a three-dimensional (3D) map of the area stored in database 410. Localization system 406 then determines the position of the vehicle in the area based on localization system 406 comparing the at least one point cloud or the combined point cloud to the map. In some embodiments, the map includes a combined point cloud of the area generated prior to navigation of the vehicle. In some embodiments, maps include, without limitation, high-precision maps of the roadway geometric properties, maps describing road network connectivity properties, maps describing roadway physical properties (such as traffic speed, traffic volume, the number of vehicular and cyclist traffic lanes, lane width, lane traffic directions, or lane marker types and locations, or combinations thereof), and maps describing the spatial locations of road features such as crosswalks, traffic signs or other travel signals of various types. In some embodiments, the map is generated in real-time based on the data received by the perception system.

In another example, localization system 406 receives Global Navigation Satellite System (GNSS) data generated by a global positioning system (GPS) receiver. In some examples, localization system 406 receives GNSS data associated with the location of the vehicle in the area and localization system 406 determines a latitude and longitude of the vehicle in the area. In such an example, localization system 406 determines the position of the vehicle in the area based on the latitude and longitude of the vehicle. In some embodiments, localization system 406 generates data associated with the position of the vehicle. In some examples, localization system 406 generates data associated with the position of the vehicle based on localization system 406 determining the position of the vehicle. In such an example, the data associated with the position of the vehicle includes data associated with one or more semantic properties corresponding to the position of the vehicle.

In some embodiments, control system 408 receives data associated with at least one trajectory from planning system 404 and control system 408 controls operation of the vehicle. In some examples, control system 408 receives data associated with at least one trajectory from planning system 404 and control system 408 controls operation of the vehicle by generating and transmitting control signals to cause a powertrain control system (e.g., DBW system 202h, powertrain control system 204, and/or the like), a steering control system (e.g., steering control system 206), and/or a brake system (e.g., brake system 208) to operate. For example, control system 408 is configured to perform operational functions such as a lateral vehicle motion control or a longitudinal vehicle motion control. The lateral vehicle motion control causes activities necessary for the regulation of the y-axis component of vehicle motion. The longitudinal vehicle motion control causes activities necessary for the regulation of the x-axis component of vehicle motion. In an example, where a trajectory includes a left turn, control system 408 transmits a control signal to cause steering control system 206 to adjust a steering angle of vehicle 200, thereby causing vehicle 200 to turn left. Additionally, or alternatively, control system 408 generates and transmits control signals to cause other devices (e.g., headlights, turn signal, door locks, windshield wipers, and/or the like) of vehicle 200 to change states.

In some embodiments, perception system 402, planning system 404, localization system 406, and/or control system 408 implement at least one machine learning model (e.g., at least one multilayer perceptron (MLP), at least one convolutional neural network (CNN), at least one recurrent neural network (RNN), at least one autoencoder, at least one transformer, and/or the like). In some examples, perception system 402, planning system 404, localization system 406, and/or control system 408 implement at least one machine learning model alone or in combination with one or more of the above-noted systems. In some examples, perception system 402, planning system 404, localization system 406, and/or control system 408 implement at least one machine learning model as part of a pipeline (e.g., a pipeline for identifying one or more objects located in an environment and/or the like).

Database 410 stores data that is transmitted to, received from, and/or updated by perception system 402, planning system 404, localization system 406 and/or control system 408. In some examples, database 410 includes a storage component (e.g., a storage component that is the same as or similar to storage component 308 of FIG. 3) that stores data and/or software related to the operation and uses at least one system of autonomous vehicle compute 400. In some embodiments, database 410 stores data associated with 2D and/or 3D maps of at least one area. In some examples, database 410 stores data associated with 2D and/or 3D maps of a portion of a city, multiple portions of multiple cities, multiple cities, a county, a state, a State (e.g., a country), and/or the like). In such an example, a vehicle (e.g., a vehicle that is the same as or similar to vehicles 102 and/or vehicle 200) can drive along one or more drivable regions (e.g., single-lane roads, multi-lane roads, highways, back roads, off road trails, and/or the like) and cause at least one LiDAR sensor (e.g., a LiDAR sensor that is the same as or similar to LiDAR sensors 202b) to generate data associated with an image representing the objects included in a field of view of the at least one LiDAR sensor.

In some embodiments, database 410 can be implemented across a plurality of devices. In some examples, database 410 is included in a vehicle (e.g., a vehicle that is the same as or similar to vehicles 102 and/or vehicle 200), an autonomous vehicle system (e.g., an autonomous vehicle system that is the same as or similar to remote AV system 114, a fleet management system (e.g., a fleet management system that is the same as or similar to fleet management system 116 of FIG. 1, a V2I system (e.g., a V2I system that is the same as or similar to V2I system 118 of FIG. 1) and/or the like.

Example Systems for Dissipating Heat from Vehicle-Based Devices Having Electronic Circuitry In general, a vehicle (e.g., an autonomous vehicle) includes devices having electronic circuitry (e.g., electronic devices) that generate heat during operation. As an example, a vehicle can include one or more processors 304 (e.g., CPUs, GPUs, ALIs, APUs, DSPs, FPGA, ASICs, systems on a chip (SoCs), etc.) for processing data to provide the functionality described herein. As further examples, a vehicle include memory 306 and/or storage component 308 (e.g., flash memory, magnetic memory, optical memory, RAM, PROM, EPROM, FLASH-EPROM, NV-RAM, etc.) for storing data prior to, during, and subsequent to processing. As further examples, a vehicle can include one or more communication interfaces 314 (e.g., transceivers, receivers, transmitters, etc.) for receiving and/or transmitting data. Other example electronic devices are shown and described with reference to FIG. 3. These electronic devices can implement one or more of a systems, modules, and/or other components of a vehicle, such as those shown and described with reference to FIGS. 1, 2, and 4.

During operation of the vehicle, heat generated by these electronic devices is dissipated into the surrounding environment to maintain a temperature of the electronic devices within a particular operational temperature range (e.g., such that the devices remain in good working order). As an example, the electronic devices are kept sufficiently cool (e.g., having a temperature lower than a particular threshold temperature) to operate in an optimal manner.

In some implementations, heat from these devices is dissipated using a heat dissipation device. In an example embodiment, a heat dissipation device includes an enclosure that receives one or more electronic devices, a heat sink, and a fan for extracting heat from the electronic devices and dissipating the heat into the surrounding environment. Further, the heat dissipation device is configured for insertion in an aperture of a wall of the vehicle's interior compartment (e.g., a wall of a passenger compartment and/or cargo compartment), such that the heat sink and the fan are positioned on the exterior of the vehicle, while the enclosure and the one or more electronic devices within the enclosure are positioned within the vehicle's interior compartment. At least in some embodiments, the heat dissipation devices enable electronic devices of the vehicle to be cooled in a more efficient and/or effective manner when compared to traditional heat dissipation techniques.

As an example, as the heat dissipation device's heat sink and fan are positioned on the exterior of the vehicle, heat from the electronic devices is at least partially dissipated into the exterior environment rather than entirely into the vehicle's interior compartment. In some implementations, this improves passenger comfort and/or reduces a load on the vehicle's air conditioning system (e.g., compared to dissipating the entirety of the heat directly into the vehicle's interior compartment). Further, the heat dissipation device enables the electronic devices to be passively cooled by the exterior air as the vehicle travels through the environment.

As another example, as the enclosure and the electronic devices are positioned within the interior compartment, the enclosure and the electronic devices are protected from the exterior environment. Accordingly, the enclosure and the electronic devices need not include extensive weather proofing features, which may increase complexity, size, and/or cost of the enclosure and/or the electronic devices.

Figure 5A:
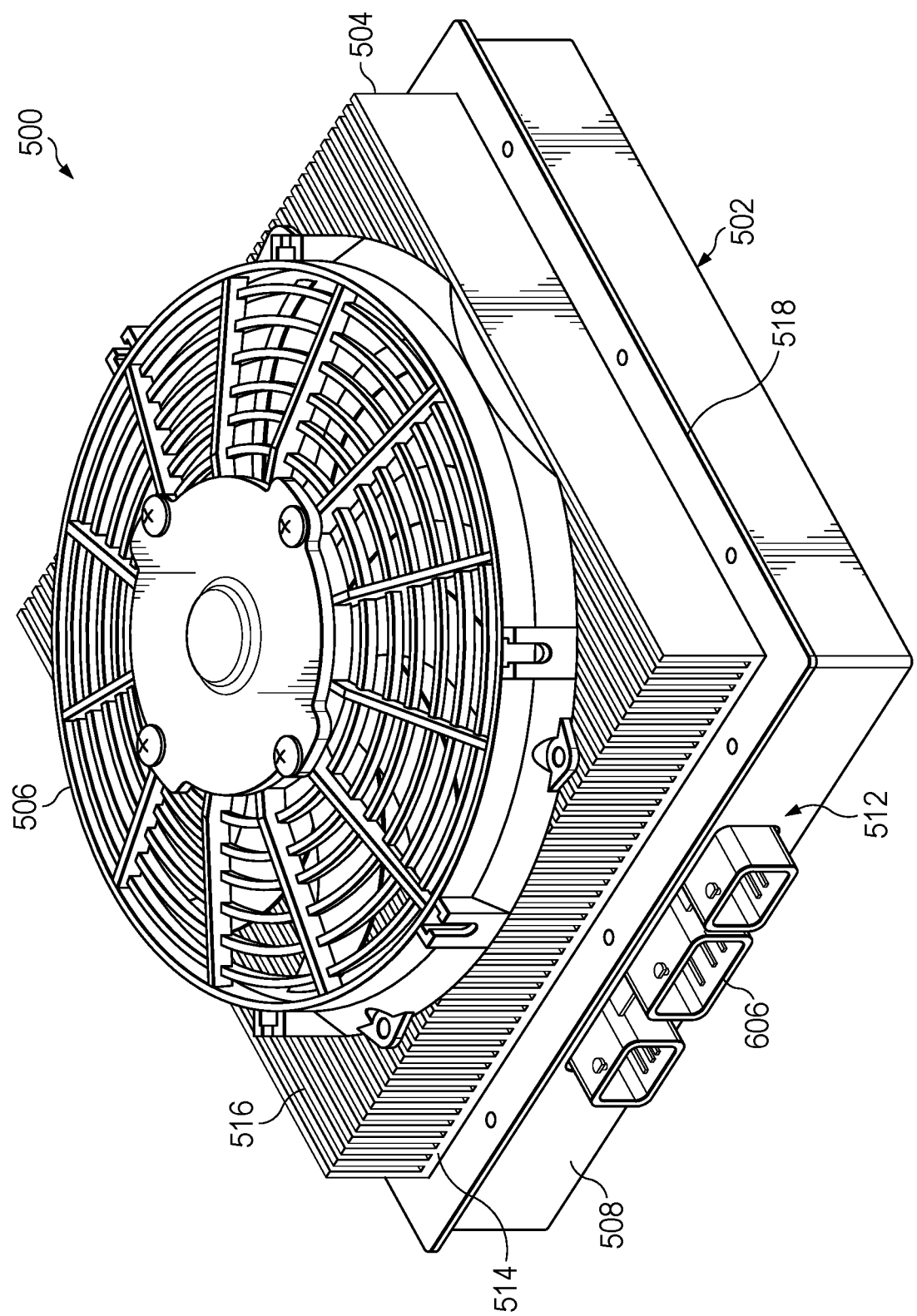
FIGS. 5A-5E are diagrams of an example heat dissipating device.
Figure 5B:
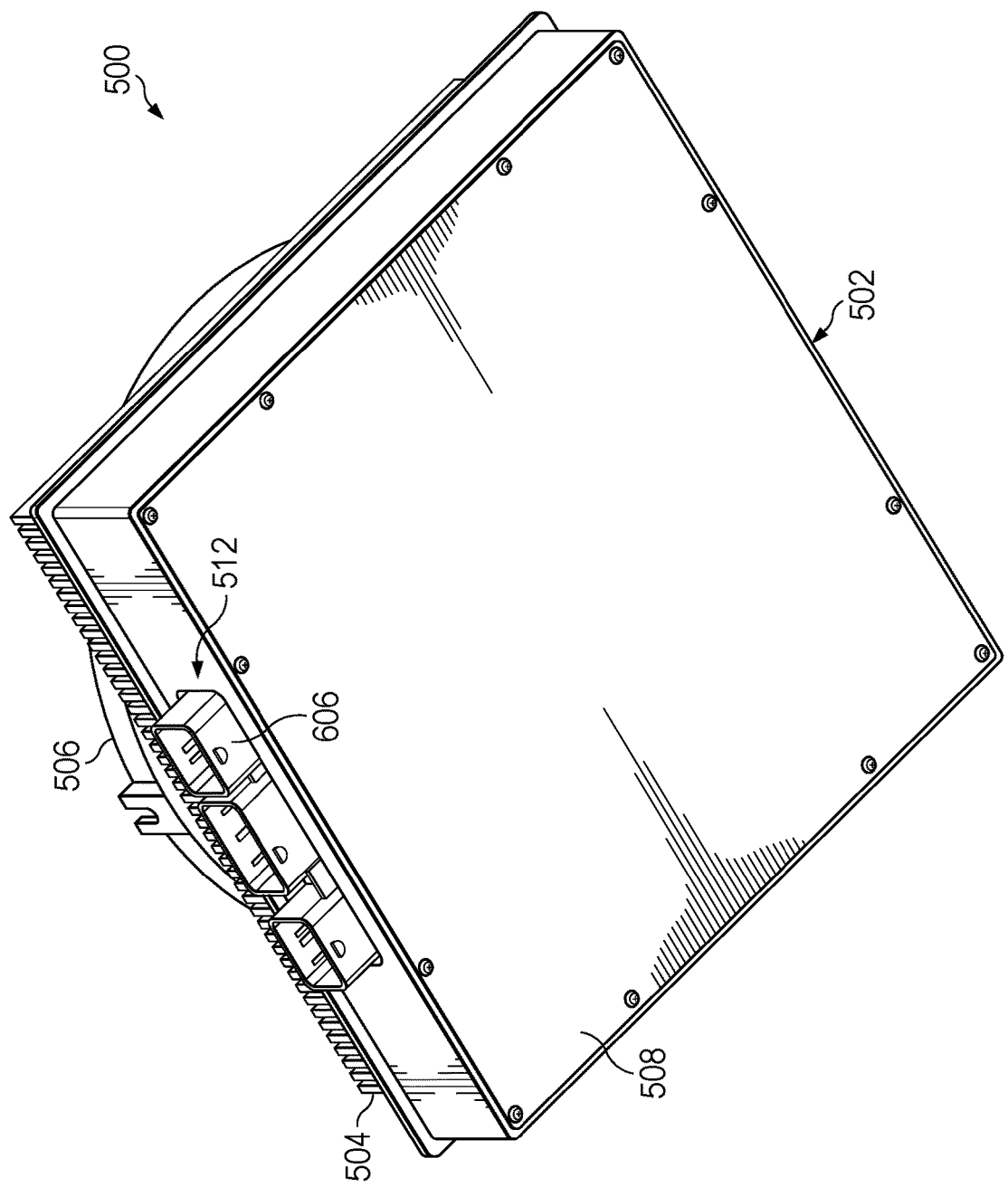
Figure 5C:
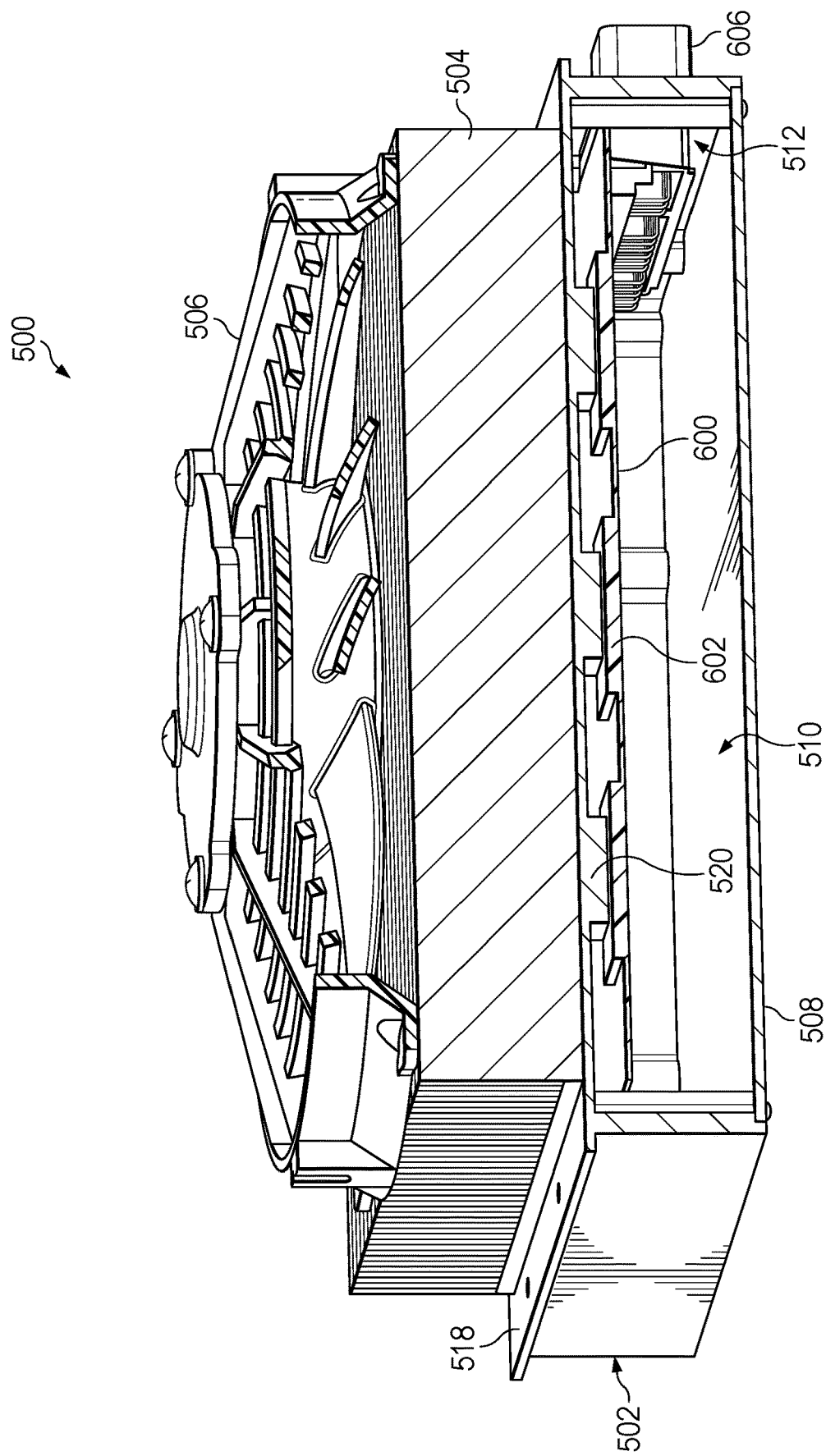
Figure 5D:
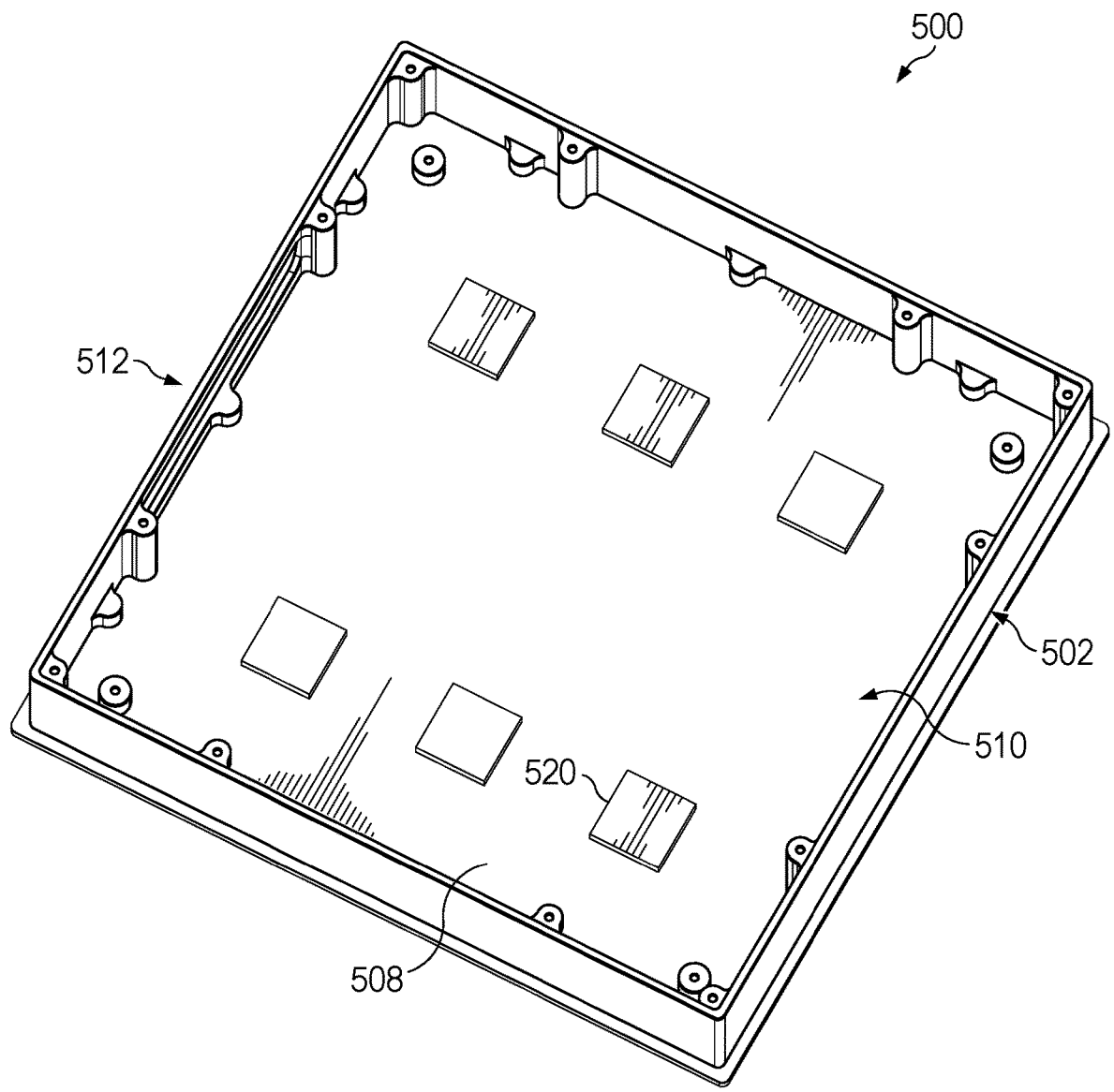
Figure 5E:
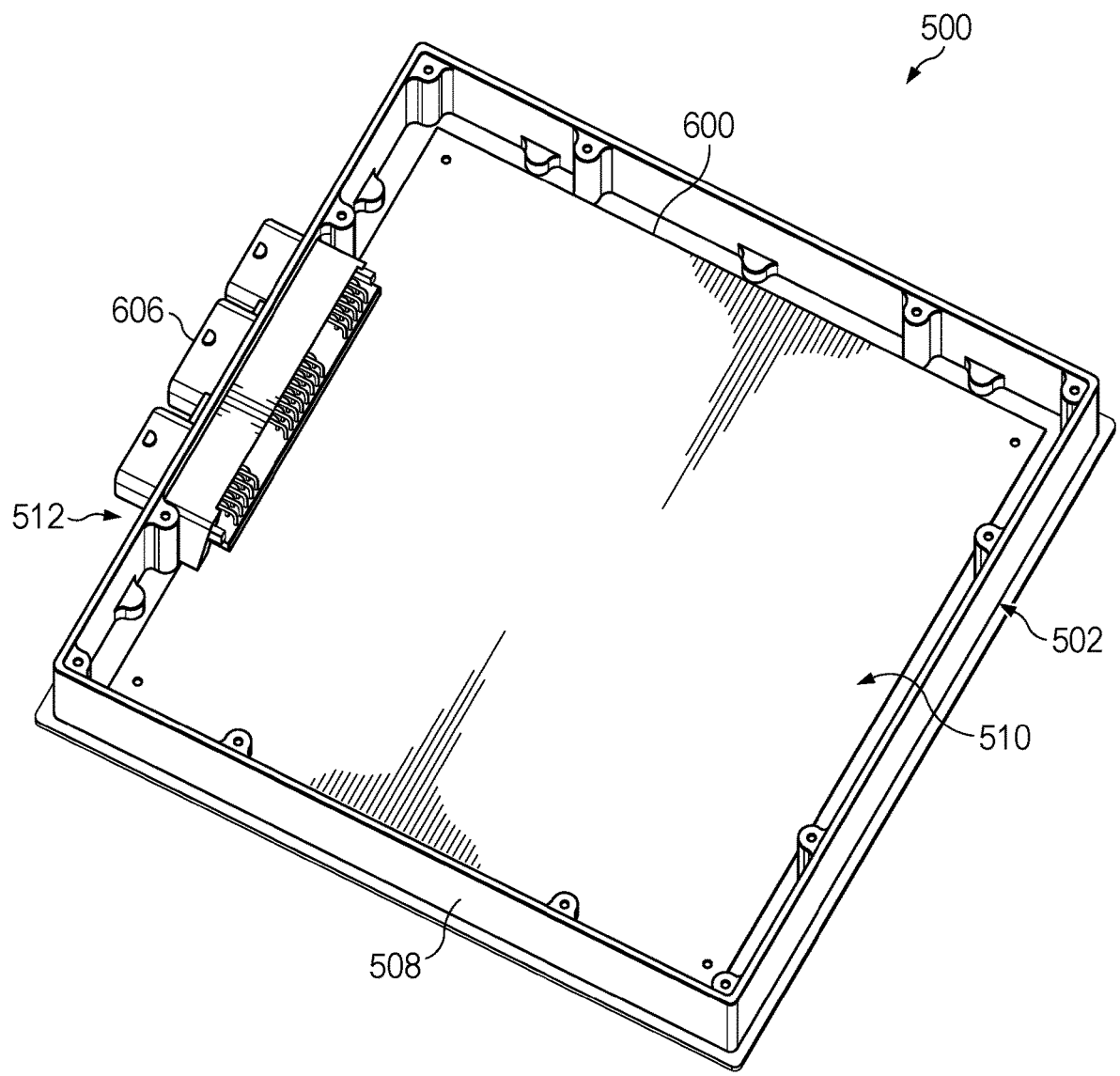

FIGS. 5A-5E show an example heat dissipation device 500 for dissipating heat generated by electronic devices of a vehicle into the exterior environment (e.g., outside of the vehicle). The heat dissipating device 500 includes an enclosure 502, a heat sink 504, and a fan 506. Each of FIGS. 5A-5E shows a different view of the example heat dissipation device 500. FIGS. 5C and 5E show the example heat dissipation device 500 coupled with an electronic device (e.g., electronic device 600 of FIG. 6).

The enclosure 502 is configured to receive one or more electronic devices 600, such that the one or more electronic devices 600 are secured to and thermally coupled to the heat dissipating device 500. The enclosure 502 includes walls 508 defining a cavity 510 (e.g., as shown in FIGS. 5C-5E), and one or more apertures 512 defined along one or more of the walls 508. For ease of illustration, FIGS. 5A and 5B show the enclosure 502 with each of the walls 508, whereas FIGS. 5C-5E show the enclosure 502 with one or more of the walls 508 removed.

Figure 6:
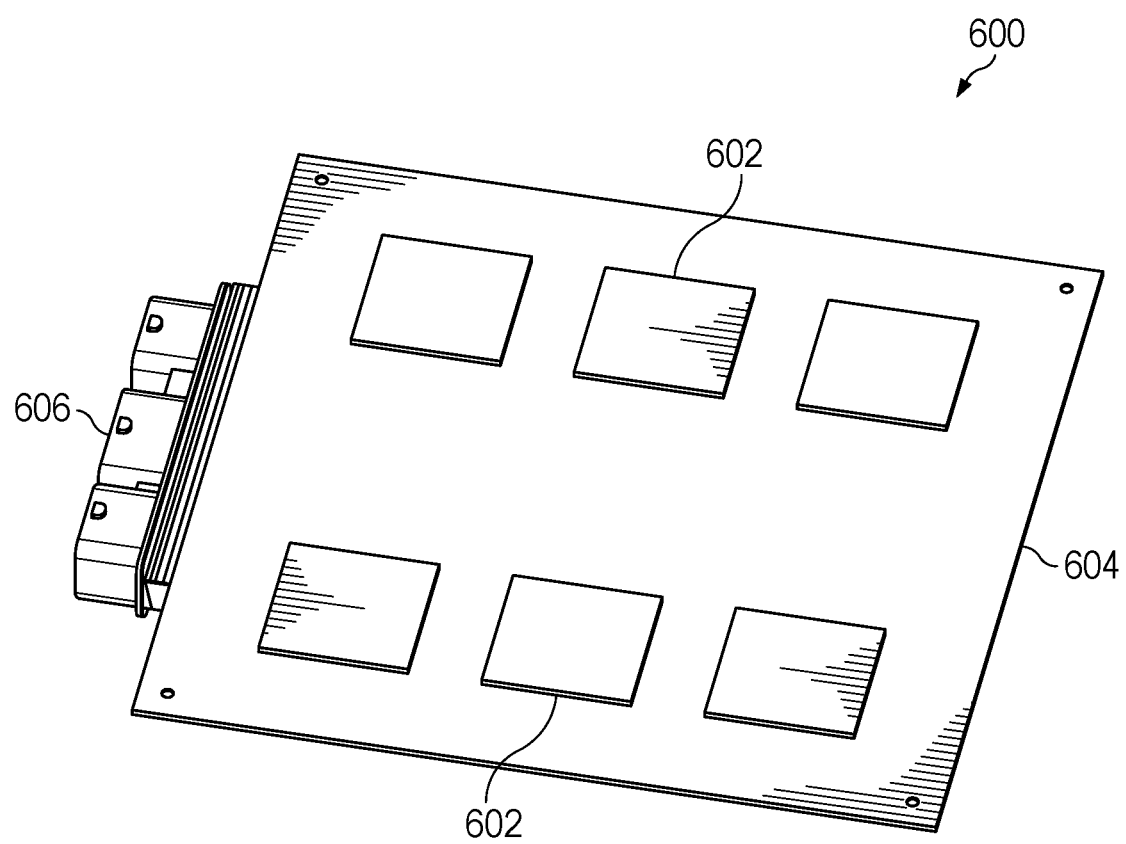
FIG. 6 is a diagram of an example electronic device.

An example electronic device 600 is shown in FIG. 6. As shown in FIG. 6, an electronic device 600 can include one or more components 602 mounted to a substrate 604 (e.g., a printed circuit board, PCB). In some implementations, the components 602 include one or more integrated circuits (e.g., chips or microchips) that are configured to facilitate the receiving, processing, storing, and/or transmitting of data. For instance, the components 602 can include one or more processors, memory, storage components, etc., or any portions thereof.

As also shown in FIG. 6, an electronic device 600 can include an interface 606 for coupling the electronic device 600 with one or more other devices. As an example, the interface 606 can include one or more ports, connectors, sockets, plugs, etc. that allow the electronic device 600 to be physically, electrically, and/or communicatively coupled with one or more other devices (e.g., by mating to one or more cables having one or more corresponding ports, connectors, sockets, plugs, etc.).

As shown in FIGS. 5A-5C and 5E, the electronic device 600 is inserted into the enclosure 502 (e.g., into the cavity 510), such that the interface 606 extends through (or is otherwise accessible through) the aperture 512 of the enclosure 502. This enables the interface 606 to be physically accessible from the exterior of the heat dissipating device 500 (e.g., such that the electronic device 600 can be coupled to one or more other devices while secured within the enclosure 502).

As described above, the enclosure 502 is configured to thermally couple the electronic device 600 to the heat dissipating device 500. As an example, the enclosure 502 can be composed, at least in part, of one or more heat conductive materials (e.g., copper, aluminum, etc., or alloys thereof). Further, the enclosure 502 is configured such that, when the electronic device 600 is inserted into the enclosure 502, one or more portions of the enclosure 502 are positioned flush against the components 602 of the electronic device 600. As an example, as shown in FIGS. 5C and 5D, the enclosure 502 includes a wall 508 having one or more protrusions 520 positioned such that, when the electronic device 600 is inserted into the enclosure 502, the one or more protrusions 520 are positioned flush against one or more of the components 602 of the electronic device 600. In some implementations, the enclosure 502 includes a thermally conductive pad or layer of material (e.g., thermally conductive paste, film, etc.) to facilitate thermal coupling between the enclosure 502 and the electronic device 600, either in addition to or instead of the protrusions 520.

The heat sink 504 is secured to and thermally coupled to the enclosure 502, such that at least a portion of the heat from the enclosure 502 (e.g., heat generated by the electronic device 600) is transferred to the heat sink 504 and dissipated in the exterior environment. The heat sink 504 is composed, at least in part, of one or more heat conductive materials (e.g., copper, aluminum, etc., or alloys thereof).

As shown in FIG. 5A, the heat sink 504 includes a base portion 514 (e.g., a solid planar portion) and several fins 516 extending from the base portion 514. The base portion 514 is positioned flush against the enclosure 502 (e.g., to facilitate an efficient transfer to heat from the enclosure 502 to the heat sink 504). Further, the fins 516 extend away from the enclosure 502 (e.g., in parallel with one another). This arrangement can be beneficial, for example, in increasing the surface area of the heat sink 504 such that heat is dissipated more quickly into the exterior environment (e.g., compared to the dissipation of heat by a heat sink without fins).

In some implementations, the enclosure 502 and the heat sink 504 are integral with one another. For example, the enclosure 502 and the heat sink 504 can be formed from a single piece of material (e.g., through machining, milling, etc.). In some implementations, the enclosure 502 and the heat sink 504 are separate respective components that are secured to another other (e.g., via fasteners, adhesive, etc.). In some implementations, a thermally conductive pad or layer of material (e.g., thermally conductive paste, film, etc.) is disposed between the enclosure 502 and the heat sink 504 to facilitate thermal coupling between the enclosure 502 and the heat sink 504.

The fan 506 is secured to the heat sink 504 opposite the enclosure 502. During operation, the fan 506 draws air through the heat sink 504 (e.g., by pushing air into the heat sink 504 and/or pulling air from the heat sink 504) to facilitate the dissipation of heat from the heat sink 504. In some implementations, the fan 506 operates according to a static rotation speed. In some implementations, the fan 506 operates according to a variable rotation speed (e.g., as described in further detail with reference to FIG. 10).

As described above, the heat dissipation device 500 is configured for insertion in an aperture of a wall of the vehicle's interior compartment (e.g., a wall of a passenger compartment and/or cargo compartment), such that the heat sink 504 and the fan 506 are at least partially positioned on the exterior of the vehicle, while the enclosure 502 and the electronic device 600 are at least partially positioned within the vehicle's interior compartment.

Figure 7A:
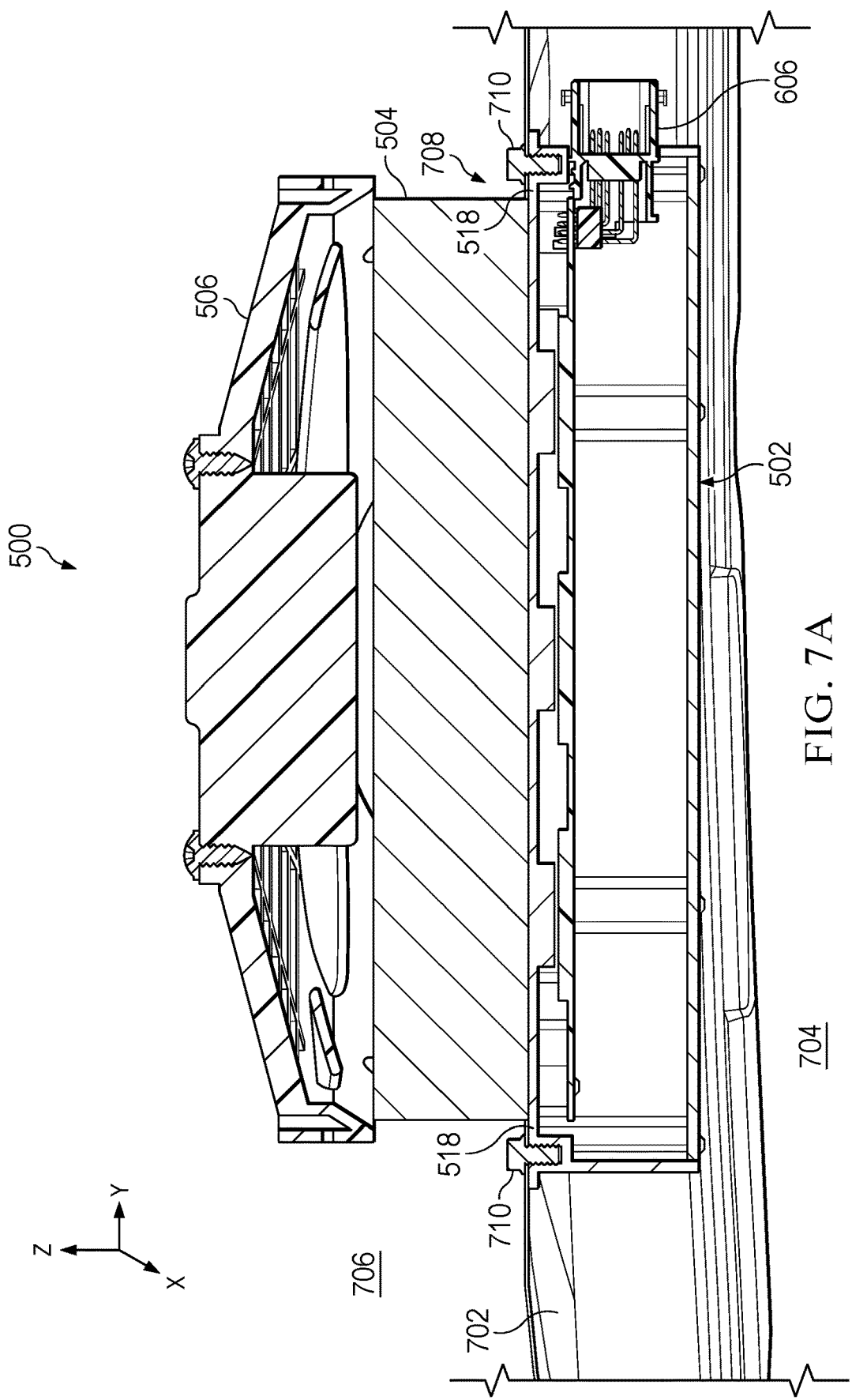
FIGS. 7A-7C are diagrams of an example heat dissipating device secured to a wall of a vehicle.
Figure 7B:
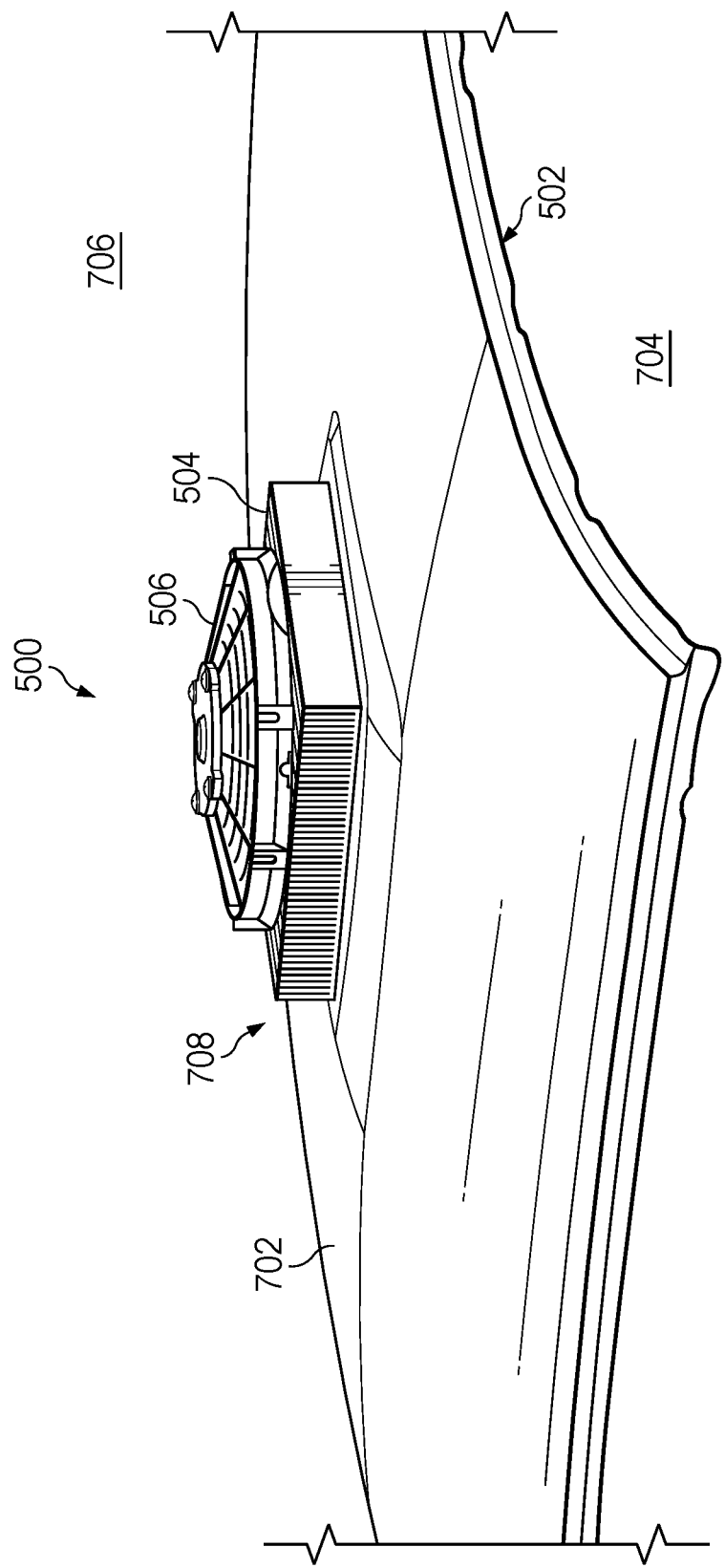
Figure 7C:
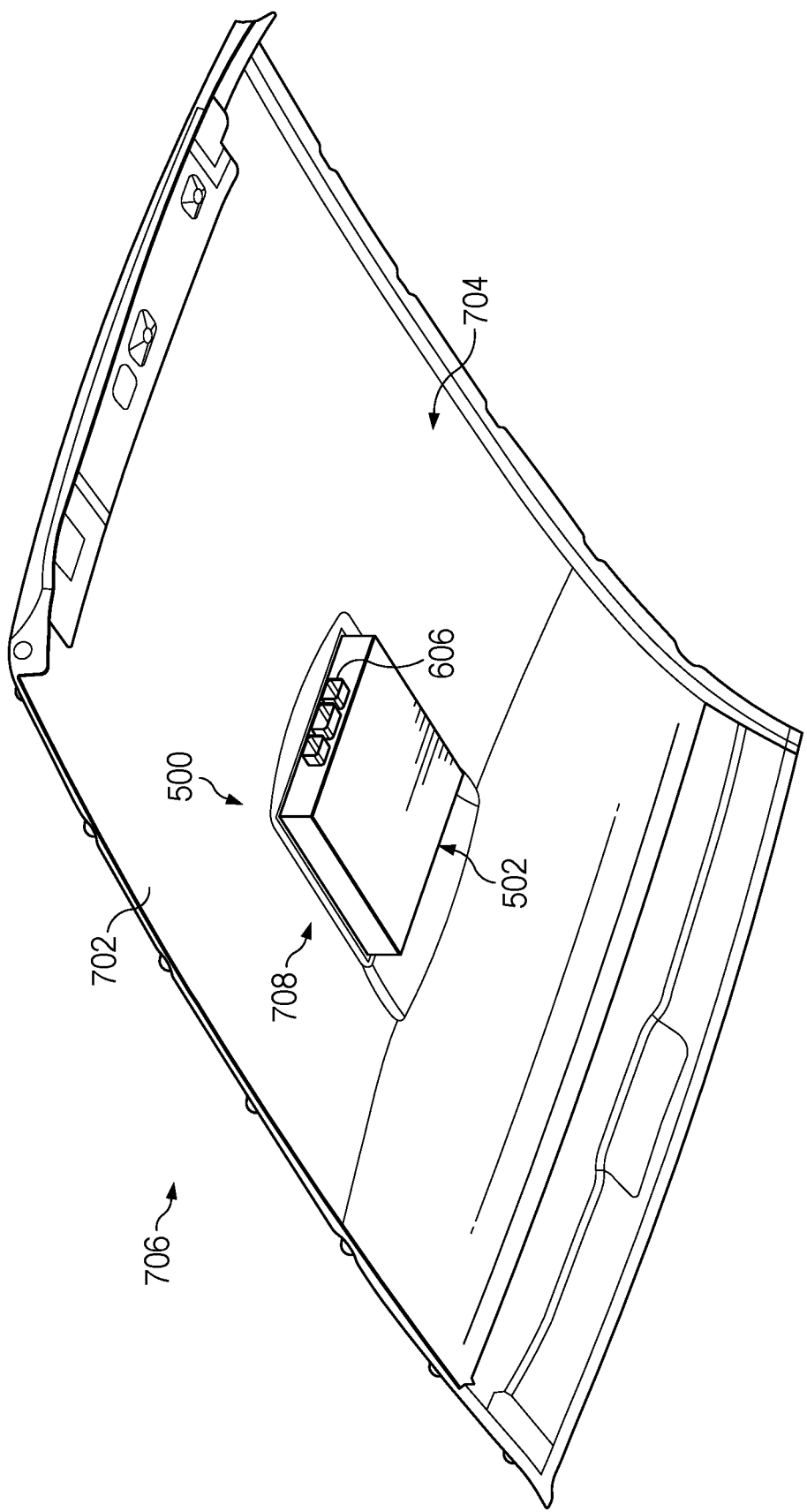

For instance, FIGS. 7A-7C show an example wall 702 of a vehicle's interior compartment 704 from a cross-sectional perspective (FIG. 7A), from a perspective in an exterior environment 706 of the vehicle (FIG. 7B), and from a perspective of the vehicle's interior compartment 704 (FIG. 7C). The wall 702 separates an interior compartment 704 of the vehicle from the exterior environment 706. As an example, the wall 702 forms an exterior shell of the vehicle and/or an interior shell of the interior compartment 704. Although illustrated as a single, uniform layer, in some examples the wall 702 varies in thickness and/or number of layers.

The wall 702 defines an aperture 708 that extends through the wall 702. The aperture 708 has a shape and dimensions corresponding to the heat dissipation device 500, such that when the heat dissipation device 500 is inserted into the aperture 708, the heat sink 504 and the fan 506 are at least partially positioned on the exterior environment 706, while the enclosure 502 and the electronic device 600 are at least partially positioned within the interior compartment 704 (e.g., as shown in FIGS. 7A-7C).

As shown in FIGS. 5A and 5C, in some implementations, the heat dissipation device 500 includes one or more flanges 518 extending along a periphery of the enclosure 502 and/or the heat sink 504 (e.g., projecting outward from the enclosure 502 and/or the heat sink 504). The flanges 518 enable the heat dissipation device 500 to be affixed more securely to the wall 702. For example, as shown in FIG. 7A, the flanges 518 are configured such that when the heat dissipation device 500 is inserted into the aperture 708, the flanges 518 are positioned flush against the wall 702. The heat dissipation device 500 is secured to the wall 702, at least in part, via one or more fasteners 710 between the flanges 518 and the wall 702 (e.g., screws, bolts, etc.) and/or adhesive between the flanges 518 and wall 702. In some implementations, the flanges are planar (e.g., such that they can be positioned flush against a planar portion of the wall 702). In some implementations, the flanges have one or more curved portions (e.g., such that they can be positioned flush against one or more curved portions of the wall 702). In some implementations, an air tight and/or water tight seal is formed between the flanges 518 and the wall 702 (e.g., using the flanges 518 and wall 702 alone, or with a weather proof seal or gasket).

In some implementations, a cross sectional area of the enclosure 502 along a particular plane (e.g., a plane parallel to the x-y plane shown in FIG. 7A) is greater than a cross-sectional area of the aperture 708 along that plane. As an example, the dimensions of the enclosure 502 along one or more directions (e.g., the x and y directions) is greater than the dimensions of the aperture 708 along the one or more directions. In some implementations, the cross sectional area of the enclosure 502 is defined, at least in part, by the flanges 518. This can be beneficial, for example, in restricting the heat dissipation device 500 from passing entirely through the aperture 708 (e.g., such that the heat dissipation device 500 is less likely to fall from the vehicle into the exterior environment 706).

As shown in FIGS. 7A-7C, when the heat dissipation device 500 is inserted into the aperture 708, the heat sink 504 and the fan 506 are at least partially positioned on the exterior environment 706, while the enclosure 502 and the electronic device 600 are at least partially positioned within the interior compartment 704. Further, the interface 606 of the electronic device 600 is accessible from the interior compartment 704. This can be beneficial, for example, in protecting the enclosure 502 and the electronic device 600 (including the interface 606 of the electronic device 600) from the exterior environment. Accordingly, the enclosure 502 and the electronic device 600 need not include extensive weather proofing features, which may increase complexity, size, and/or cost. For example, in some implementations, the enclosure 502 is not air tight and/or liquid tight (e.g., the enclosure 502 can be permeable to air and/or liquid). As another example, in some implementations, the enclosure 502 does not include any water proof seals surrounding the interface 606. As another example, in some implementations, the electronic device is not configured to be water resistant or water proof.

Figure 8:
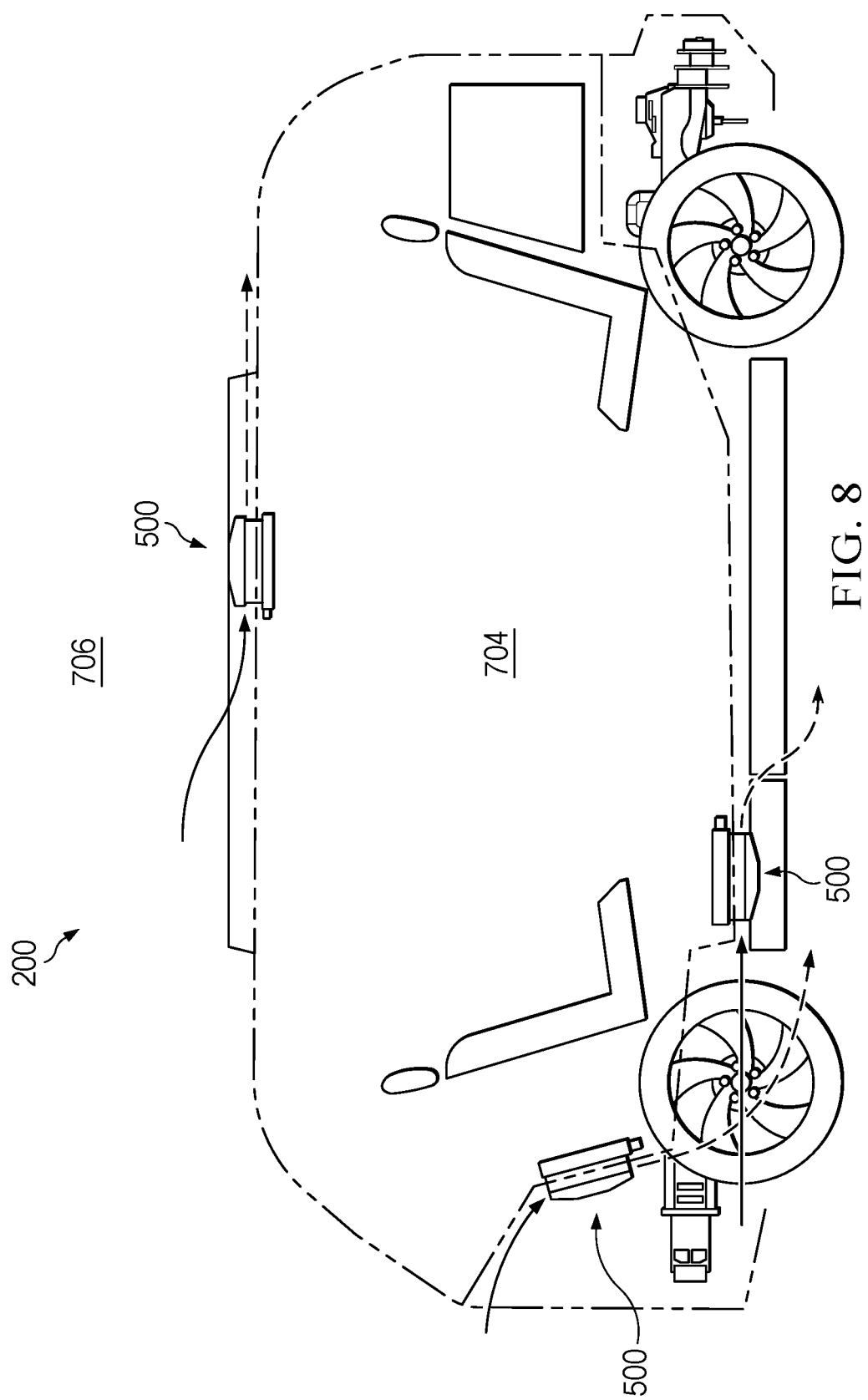
FIG. 8 is a diagram of example heat dissipating devices secured to a vehicle.

In general, the heat dissipation device 500 is positioned along any portion along the exterior of a vehicle. As an example, FIG. 8 shows a vehicle 200 with heat dissipation devices 500 positioned along a top, front, and bottom of the vehicle 200. In some implementations, a heat dissipation device 500 is positioned along the rear of a vehicle, along the sides of a vehicle 200, or along any other portion of the vehicle 200.

In some implementations, the heat dissipation device 500 is positioned along portions of the vehicle 200 that experience high airflow while the vehicle 200 is moving (e.g., the top, front, and/or bottom of the vehicle) to facilitate the passive dissipation of heat from the heat dissipation device 500 and the electronic device 600. Nevertheless, in practice, the heat dissipation device 500 can also be positioned along any other portion of the vehicle 200.

Figure 9A:
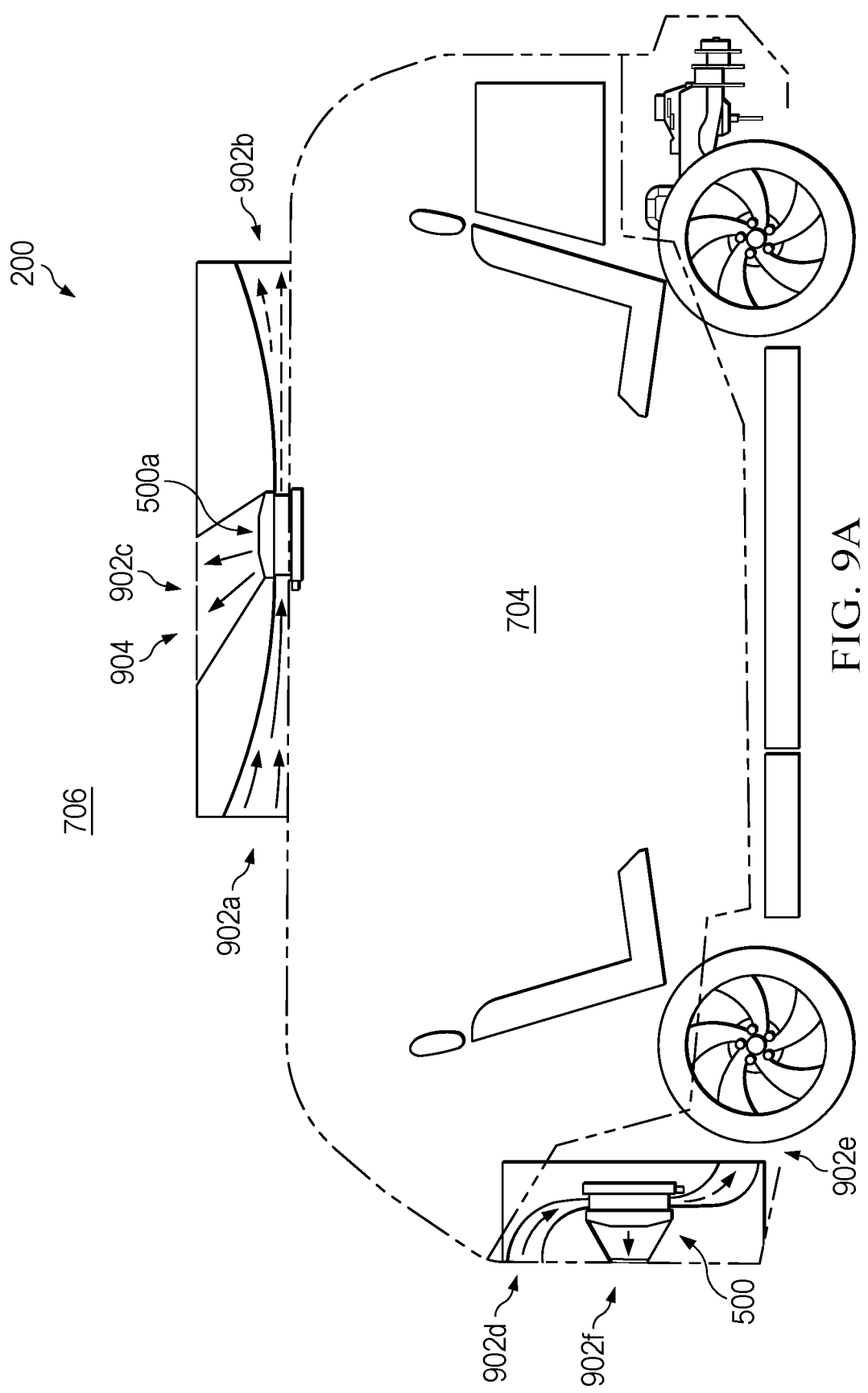

In some implementations, one or more air ducts are used to control the flow of air towards and/or away from the heat dissipation device 500. As an example, as shown in FIGS. 9A-9B, a vehicle 200 includes a heat dissipation device 500a secured along a top of the vehicle 200 (e.g., along the roof of the vehicle 200). Further, the vehicle 200 includes an air duct 902a to direct air from the front of the vehicle 200 towards the heat dissipation device 500a, and an air duct 902b to direct air from the heat dissipation device 500a towards the rear of the vehicle 200.

Further, the vehicle 200 includes an air duct 902c to direct air above the vehicle 200 towards the heat dissipation device 500a, and vice versa. For example, the fan of the heat dissipation device 500a is configured to push air from the exterior environment 706 towards the heat dissipation device 500a. As shown in FIG. 9A, when the fan is not in operation, the air duct 902c directs air from the heat dissipation device 500a away from top of the vehicle 200 (e.g., to facilitate passive dissipation of heat). Further, as shown in FIG. 9B, when the fan is in operation, the air duct 902c directs air from above the vehicle 200 to the heat dissipation device 500a (e.g., to facilitate active dissipation of heat). In some implementations, the air duct 902c is angled from the heat dissipation device 500a towards a front of the vehicle 200 to facilitate the direction of air in this manner.

As another example, as shown in FIGS. 9A-9B, a vehicle 200 includes a heat dissipation device 500b secured along the front of the vehicle 200. Further, the vehicle 200 includes an air duct 902d to direct air from the front of the vehicle 200 towards the heat dissipation device 500b, and an air duct 902e to direct air from the heat dissipation device 500b towards the rear of the vehicle 200.

Further, the vehicle 200 includes an air duct 902f to direct air from the front of the vehicle 200 towards the heat dissipation device 500a, and vice versa. For example, the fan of the heat dissipation device 500b is configured to push air from the exterior environment 706 towards the heat dissipation device 500a. As shown in FIG. 9A, when the fan is not in operation, the air duct 902f directs air from the heat dissipation device 500a away from the vehicle 200 (e.g., to facilitate passive dissipation of heat). Further, as shown in FIG. 9B, when the fan is in operation, the air duct 902f directs air from the front of the vehicle 200 to the heat dissipation device 500b (e.g., to facilitate active dissipation of heat). In some implementations, one or more of the air ducts (e.g., the air ducts 902d and/or 902e) is curved to facilitate the direction of air in this manner.

In some implementations, the opening of an air duct that is closer to a heat dissipation device 500 is narrower than opposite opening of the air duct (e.g., the opening of the air duct that is farther from the heat dissipation device 500). For instance, the opening of an air duct that is closer to a heat dissipation device 500 has a cross sectional area that is smaller than that of the opposite opening of the air duct. This is beneficial, for example, in compressing the flow of air towards the heat dissipation device 500 (e.g., such that heat is dissipated more quickly by heat dissipation device 500) and/or in improving the flow of air away from the heat dissipation device 500 (e.g., by reducing turbulence as the air flow away from the heat dissipation device 500). For instance, in the examples shown in FIGS. 9A-9B, the air ducts 902a-902e are configured in this manner.

In some implementations, the opening of an air duct that is closer to a heat dissipation device 500 is wider than opposite opening of the air duct (e.g., the opening of the air duct that is farther from the heat dissipation device 500). As an example, the opening of an air duct that is closer to a heat dissipation device 500 can have a cross sectional area that is larger than that of the opposite opening of the air duct. For instance, in the examples shown in FIGS. 9A-9B, the air duct 902f is configured in this manner.

In some implementations, multiple air ducts are positioned on a front of the vehicle. Further, the inlet of one of the air ducts has a different size than the inlet of another one of the air ducts (e.g., a different cross-sectional area). This is beneficial, for example, in creating a pressure differential that forces air to flow through the air ducts.

For instance, in the examples shown in FIGS. 9A-9B, the air duct 902d and the air duct 902f are arranged on the front of the vehicle 200. The inlet of the air duct 902d (e.g., the opening of the air duct 902d that is farther from the heat dissipation device 500) is greater in size than the inlet of the air duct 902f (e.g., the opening of the air duct 902f that is farther from the heat dissipation device 500). This configuration creates a pressure differential that forces air to flow from the air duct 902d to the air duct 902e. Accordingly, the heat dissipation device 500 can be passively cooled by the flow of air while the vehicle 200 is in motion, without requiring operation of the fan 506. Further, while the vehicle is stopped (or traveling slowly), the fan 506 can draw air through the air duct 902f.

In some implementations, the flow of air into one or more of the air ducts is controlled by one or more adjustable vents. For example, an adjustable vent includes a door or baffle that is selectively opened or closed to restrict the flow of air through an air duct (either partially or entirely). As another example, an adjustable vent includes a valve is selectively opened or closed to restrict the flow of air through an air duct in a particular direction (either partially or entirely).

For instance, as shown in FIGS. 9A-9B, adjustable vents 904 is used to control the air through the air duct 902c. As shown in FIG. 9A, the adjustable vents 904 are selectively closed to prevent the flow of air from the exterior environment 706 into the air duct 902c (e.g., to allow air to flow more freely through the air duct 902c from the heat dissipation device 500 to the exterior environment 706 to facilitate passive heat dissipation). Further, as shown in FIG. 9A, the adjustable vents 904 are selectively closed to allow the flow of air from the exterior environment 706 into the air duct 902c (e.g., to provide air to the fan 506 of the heat dissipation device 500 through the air duct 902c to facilitate active heat dissipation).

In some implementations, adjustable vents 904 are selectively opened or closed based on an air pressure within their respective air ducts. In some implementations, if the air pressure within an air duct is above a particular threshold pressure, the adjustment vent 904 corresponding to that air duct automatically opens. In some implementations, if the air pressure within an air duct is above a particular threshold pressure, the adjustment vent 904 corresponding to that air duct automatically closes. In some implementations, if the air pressure within an air duct is below a particular threshold pressure, the adjustment vent 904 corresponding to that air duct automatically opens. In some implementations, if the air pressure within an air duct is below a particular threshold pressure, the adjustment vent 904 corresponding to that air duct automatically closes.

Figure 10:
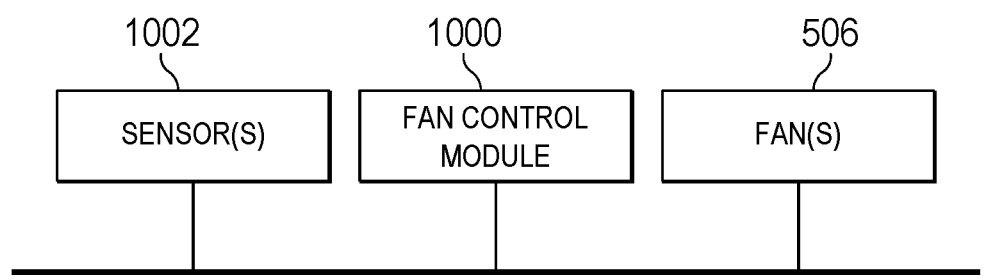
FIG. 10 is a diagram of an example fan control module.

As described above, the fan 506 can operate according to a variable rotation speed. As shown in FIG. 10, the operation of the fan 506 is controlled by a fan control module 1000 based on measurements obtained by one or more sensors 1002. The fan control module 1000 is implemented, for example, using one or more devices 300, as shown and described with reference to FIG. 3. In examples, control of the fan control module 1000 is implemented (e.g., completely, partially, and/or the like) by remote AV system 114, vehicle 200 (e.g., autonomous system 202 of vehicle 200), and/or AV compute 400 (e.g., one or more systems of AV compute 400).

In some implementations, the fan control module 1000 controls the operation of the fan 506 based on one or more characteristics of the electronic device 600, as measured by the one or more sensors 1002. As an example, the one or more sensors 1002 measures a temperature of the electronic device 600 (and/or its constituent electronic circuitry), and the fan control module 1000 controls a rotation speed of the fan based on the measured temperature. For instance, if all other conditions remain unchanged, the fan control module 1000 increases the rotation speed of the fan in response to an increase in the measured temperature, and decreases the rotation speed of the fan in response to a decrease in the measured temperature.

As another example, the one or more sensors 1002 measures a power draw of the electronic device 600 (and/or its constituent electronic circuitry), and the fan control module 1000 controls a rotation speed of the fan based on the measured power draw. For instance, if all other conditions remain unchanged, the fan control module 1000 increases the rotation speed of the fan in response to an increase in the measured power draw, and decreases the rotation speed of the fan in response to a decrease in the measured power draw.

As another example, the one or more sensors 1002 measures a utilization metric of the electronic device 600 (and/or its constituent electronic circuitry), and the fan control module 1000 controls a rotation speed of the fan based on the measured utilization metric. In some implementations, the utilization metric represents the degree of which the electronic device 600 (and/or its constituent electronic circuitry) are being used to process data (e.g., CPU time, GPU time, etc.). For instance, if all other conditions remain unchanged, the fan control module 1000 increases the rotation speed of the fan in response to an increase in the measured utilization metric, and decreases the rotation speed of the fan in response to a decrease in the measured power utilization metric.

In some implementations, the fan control module 1000 controls the operation of the fan 506 based on one or more characteristics of the vehicle 200, as measured by the one or more sensors 1002. As an example, the one or more sensors 1002 measures a velocity of the vehicle 200, and the fan control module 1000 controls a rotation speed of the fan based on the measured velocity. For instance, if all other conditions remain unchanged, the fan control module 1000 increases the rotation speed of the fan in response to a decrease in the measured velocity, and decreases the rotation speed of the fan in response to an increase in the measured velocity. This is beneficial, for example, as passive heat dissipation may be more effective when the vehicle is moving quickly (and thus the fan is operated more slowly and/or stopped without negatively affecting the operation of the electronic device), whereas as passive heat dissipation may be less effective when the vehicle is moving slowly (and thus the fan is operated more quickly).

In some implementations, the fan control module 1000 stops operation of the fan (e.g., sets the rotation speed to zero) when the velocity of the vehicle is greater than a particular threshold velocity. Further, the fan control module 1000 operates the fan (e.g., set the rotation speed to a value greater than zero) when the velocity of the vehicle is less than the threshold velocity. For example, the fan control module 1000 operates the fan when the vehicle is stopped, and stops the fan from operating when the vehicle is in motion. Other threshold velocities are also possible, depending on the implementation.

In some implementations, the fan control module 1000 controls the operation of the fan 506 based on one or more characteristics of the interior compartment 704 and/or the exterior environment 706, as measured by the one or more sensors 1002. As an example, the one or more sensors 1002 measure a temperature of the exterior environment 706, and the fan control module 1000 controls a rotation speed of the fan based on the measured temperature. For instance, if all other conditions remain unchanged, the fan control module 1000 increases the rotation speed of the fan in response to an increase in the measured temperature, and decreases the rotation speed of the fan in response to a decrease in the measured temperature.

As another example, the one or more sensors 1002 measures a humidity of the exterior environment 706, and the fan control module 1000 controls a rotation speed of the fan based on the measured humidity. For instance, if all other conditions remain unchanged, the fan control module 1000 increases the rotation speed of the fan in response to an increase in the measured humidity, and decreases the rotation speed of the fan in response to a decrease in the measured humidity.

As another example, the one or more sensors 1002 measures a temperature of the interior compartment 704, and the fan control module 1000 controls a rotation speed of the fan based on the measured temperature. For instance, if all other conditions remain unchanged, the fan control module 1000 increases the rotation speed of the fan in response to an increase in the measured temperature, and decreases the rotation speed of the fan in response to a decrease in the measured temperature.

As another example, the one or more sensors 1002 measures a humidity of the interior compartment 704, and the fan control module 1000 controls a rotation speed of the fan based on the measured humidity. For instance, if all other conditions remain unchanged, the fan control module 1000 increases the rotation speed of the fan in response to an increase in the measured humidity, and decreases the rotation speed of the fan in response to a decrease in the measured humidity.

In some implementations, a single fan control module 1000 controls one or more fans 506 from a single heat dissipation device 500. In some implementations, a single fan control module 1000 controls one or more fans 506 from multiple respective heat dissipation devices 500.

According to some non-limiting embodiments or examples, provided is a heat dissipation device comprising: a heat sink; an enclosure disposed on a first side of the heat sink and thermally coupled to the heat sink, wherein the enclosure is configured to receive at least one device comprising electronic circuitry; a fan disposed on a second side of the heat sink opposite the first side; and a flange extending along a periphery of at least one of the enclosure or the heat sink, wherein the heat dissipation device is configured for insertion into an aperture of a wall of an interior compartment of a vehicle, such that: the flange is positioned against the wall, at least a portion of the enclosure is positioned within the interior compartment of the vehicle, and at least a portion of the heat sink and the fan are positioned along an exterior of the vehicle, and wherein the heat dissipation device is configured to extract heat from the electronic circuitry using the heat sink and dissipate heat from the heat sink to the exterior of the vehicle.

According to some non-limiting embodiments or examples, provided is a vehicle comprising: an interior compartment, wherein the interior compartment is at least partially defined by a wall; a heat dissipation device inserted in an aperture of the wall, the heat dissipation device comprising: a heat sink, an enclosure disposed on a first side of the heat sink and thermally coupled to the heat sink, wherein the enclosure is configured to receive at least one device comprising electronic circuitry, a fan disposed on a second side of the heat sink opposite the first side, and a flange extending along a periphery of at least one of the enclosure or the heat sink, wherein the flange is positioned against the wall, wherein the enclosure is positioned at least partially within the interior compartment of the vehicle, and wherein the heat sink and the fan are positioned at least partially along an exterior of the vehicle, and wherein the heat dissipation device is configured to extract heat from the electronic circuitry using the heat sink and dissipate heat from the heat sink to an exterior environment.

Further non-limiting aspects or embodiments are set forth in the following numbered clauses:

Clause 1: A heat dissipation device comprising: a heat sink; an enclosure disposed on a first side of the heat sink and thermally coupled to the heat sink, wherein the enclosure is configured to receive at least one device comprising electronic circuitry; a fan disposed on a second side of the heat sink opposite the first side; and a flange extending along a periphery of at least one of the enclosure or the heat sink, wherein the heat dissipation device is configured for insertion into an aperture of a wall of an interior compartment of a vehicle, such that: the flange is positioned against the wall, at least a portion of the enclosure is positioned within the interior compartment of the vehicle, and at least a portion of the heat sink and the fan are positioned along an exterior of the vehicle, and wherein the heat dissipation device is configured to extract heat from the electronic circuitry using the heat sink and dissipate heat from the heat sink to the exterior of the vehicle.

Clause 2: The heat dissipation device of Clause 1, wherein the at least device comprises at least one of: a computer processing unit (CPU), a graphics processing unit (GPU), an arithmetic-logic unit (ALU), an application-specific integrated circuit (ASIC), a system on a chip (SoC), or a computer memory device.

Clause 3: The heat dissipation device of Clause 1 or Clause 2, further comprising control circuitry configured to regulate a rotation speed of the fan.

Clause 4: The heat dissipation device of any of Clauses 1-3, wherein the control circuitry is configured to regulate the rotation speed of the fan based on a velocity of the vehicle.

Clause 5: The heat dissipation device of any of Clauses 1-4, wherein regulating the rotation speed of the fan comprises: determining that the velocity of the vehicle is a first velocity, and in response to determining that the velocity of the vehicle is the first velocity, causing the fan to operate according to a first rotation speed.

Clause 6: The heat dissipation device of any of Clauses 1-5, wherein regulating the rotation speed of the fan comprises: determining that the velocity of the vehicle is a second velocity, wherein the second velocity is greater than the first velocity, and in response to determining that the velocity of the vehicle is the second velocity, causing the fan to operate according to a second rotation speed, wherein the second rotation speed is less than the first rotation speed.

Clause 7: The heat dissipation device of any of Clauses 1-6, wherein the first velocity is zero, and the first rotation speed is greater than zero.

Clause 8: The heat dissipation device of any of Clauses 1-7, wherein the second velocity is greater than zero, and the second rotation speed is zero.

Clause 9: The heat dissipation device of any of Clauses 1-8, wherein the control circuitry is configured to regulate the rotation speed of the fan based on at least one of a temperature or a humidity of the exterior of the vehicle.

Clause 10: The heat dissipation device of any of Clauses 1-9, wherein the control circuitry is configured to regulate the rotation speed of the fan based on at least one of a temperature or a humidity of the interior compartment of the vehicle.

Clause 11: The heat dissipation device of any of Clauses 1-10, wherein the control circuitry is configured to regulate the rotation speed of the fan based on at least one characteristic of the electronic circuitry.

Clause 12: The heat dissipation device of any of Clauses 1-11, wherein the at least one characteristic of the electronic circuitry comprises at least one of: a temperature of the electronic circuitry, a power draw of the electronic circuitry, or a utilization metric associated with the electronic circuitry.

Clause 13: The heat dissipation device of any of Clauses 1-12, wherein a cross-sectional area of the enclosure is greater than a cross-sectional area of the heat sink.

Clause 14: The heat dissipation device of any of Clauses 1-13, wherein the fan is configured to direct air from the exterior of the vehicle towards the heat sink.

Clause 15: The heat dissipation device of any of Clauses 1-14, wherein the heat sink comprises: a base portion, and one or more fins extending from the base portion.

Clause 16: The heat dissipation device of any of Clauses 1-15, further comprising at least one air duct configured to direct air from the exterior of the vehicle towards at least one of the fan or the heat sink.

Clause 17: The heat dissipation device of any of Clauses 1-16, wherein the least one air duct comprises a first air duct, wherein the first air duct comprises: a first opening positioned proximal to at least one of the fan or the heat sink, and a second opening in fluid communication with the first opening and positioned opposite the first opening, wherein a cross-sectional area of the first opening is smaller than a cross-sectional area of the second opening.

Clause 18: The heat dissipation device of any of Clauses 1-17, wherein the least one air duct comprises a first air duct, wherein the first air duct comprises: a first opening positioned proximal to at least one of the fan or the heat sink, and a second opening in fluid communication with the first opening and positioned opposite the first opening, wherein a cross-sectional area of the first opening is larger than a cross-sectional area of the second opening.

Clause 19: The heat dissipation device of any of Clauses 1-18, further comprising at least one adjustable vent, wherein the at least one adjustable vent is configured to regulate a flow of air through the at least one air duct.

Clause 20: The heat dissipation device of any of Clauses 1-19, wherein the at least one adjustable vent is configured to selectively open based on an air pressure within the at least on air duct.

Clause 21: The heat dissipation device of any of Clauses 1-20, wherein the heat dissipation device is configured to form an airtight seal along the wall of the interior compartment of the vehicle.

Clause 22: The heat dissipation device of any of Clauses 1-21, wherein the enclosure is permeable to at least one of air or water.

Clause 23: The heat dissipation device of any of Clauses 1-22, wherein the interior compartment of the vehicle is at least one of a passenger compartment or a cargo compartment of the vehicle.

Clause 24: The heat dissipation device of any of Clauses 1-23, further comprising the at least one device, wherein the at least one device is at least partially disposed within the enclosure.

Clause 25: The heat dissipation device of any of Clauses 1-24, wherein the at least device comprises at least one electrical interface, and wherein the enclosure comprises at least one opening aligned with the at least one electrical interface.

Clause 26: A vehicle comprising: an interior compartment, wherein the interior compartment is at least partially defined by a wall; a heat dissipation device inserted in an aperture of the wall, the heat dissipation device comprising: a heat sink, an enclosure disposed on a first side of the heat sink and thermally coupled to the heat sink, wherein the enclosure is configured to receive at least one device comprising electronic circuitry, a fan disposed on a second side of the heat sink opposite the first side, and a flange extending along a periphery of at least one of the enclosure or the heat sink, wherein the flange is positioned against the wall, wherein the enclosure is positioned at least partially within the interior compartment of the vehicle, and wherein the heat sink and the fan are positioned at least partially along an exterior of the vehicle, and wherein the heat dissipation device is configured to extract heat from the electronic circuitry using the heat sink and dissipate heat from the heat sink to an exterior environment.

In the foregoing description, aspects and embodiments of the present disclosure have been described with reference to numerous specific details that can vary from implementation to implementation. Accordingly, the description and drawings are to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction. Any definitions expressly set forth herein for terms contained in such claims shall govern the meaning of such terms as used in the claims. In addition, when we use the term "further comprising," in the foregoing description or following claims, what follows this phrase can be an additional step or entity, or a sub-step/sub-entity of a previously-recited step or entity.

What is claimed is:

1. A heat dissipation device comprising:
   a heat sink;
   an enclosure disposed on a first side of the heat sink and thermally coupled to the heat sink, wherein the enclosure is configured to receive at least one device comprising electronic circuitry;
   a fan disposed on a second side of the heat sink opposite the first side;
   control circuitry configured to regulate a rotation speed of the fan; and
   a flange extending along a periphery of at least one of the enclosure or the heat sink,
   wherein the heat dissipation device is configured for insertion into an aperture of a wall of an interior compartment of a vehicle, such that:
      the flange is positioned against the wall,
      at least a portion of the enclosure is positioned within the interior compartment of the vehicle, and
      at least a portion of the heat sink and the fan are positioned along an exterior of the vehicle, and
      wherein the heat dissipation device is configured to extract heat from the electronic circuitry using the heat sink and dissipate heat from the heat sink to the exterior of the vehicle,
   wherein the control circuitry is configured to regulate the rotation speed of the fan based on a velocity of the vehicle, and
   wherein regulating the rotation speed of the fan comprises:
      determining that the velocity of the vehicle is a first velocity, and
      in response to determining that the velocity of the vehicle is the first velocity, causing the fan to operate according to a first rotation speed.

2. The heat dissipation device of claim 1, wherein the at least one device comprises at least one of:
   a computer processing unit (CPU),
   a graphics processing unit (GPU),
   an arithmetic-logic unit (ALU),
   an application-specific integrated circuit (ASIC),
   a system on a chip (SoC), or
   a computer memory device.

3. The heat dissipation device of claim 1, wherein regulating the rotation speed of the fan comprises:
   determining that the velocity of the vehicle is a second velocity, wherein the second velocity is greater than the first velocity, and
   in response to determining that the velocity of the vehicle is the second velocity, causing the fan to operate according to a second rotation speed, wherein the second rotation speed is less than the first rotation speed.

4. The heat dissipation device of claim 3, wherein the first velocity is zero, and the first rotation speed is greater than zero.

5. The heat dissipation device of claim 4, wherein the second velocity is greater than zero, and the second rotation speed is zero.

6. The heat dissipation device of claim 1, wherein the control circuitry is configured to regulate the rotation speed of the fan based on at least one of a temperature or a humidity of the exterior of the vehicle.

7. The heat dissipation device of claim 1, wherein the control circuitry is configured to regulate the rotation speed of the fan based on at least one of a temperature or a humidity of the interior compartment of the vehicle.

8. The heat dissipation device of claim 1, wherein the control circuitry is configured to regulate the rotation speed of the fan based on at least one characteristic of the electronic circuitry.

9. The heat dissipation device of claim 8, wherein the at least one characteristic of the electronic circuitry comprises at least one of:
a temperature of the electronic circuitry,
a power draw of the electronic circuitry, or
a utilization metric associated with the electronic circuitry.

10. The heat dissipation device of claim 1, wherein a cross-sectional area of the enclosure is greater than a cross-sectional area of the heat sink.

11. The heat dissipation device of claim 1, wherein the fan is configured to direct air from the exterior of the vehicle towards the heat sink.

12. The heat dissipation device of claim 1, wherein the heat sink comprises:
a base portion, and
one or more fins extending from the base portion.

13. The heat dissipation device of claim 1, further comprising at least one air duct configured to direct air from the exterior of the vehicle towards at least one of the fan or the heat sink.

14. The heat dissipation device of claim 1, wherein the heat dissipation device is configured to form an airtight seal along the wall of the interior compartment of the vehicle.

15. The heat dissipation device of claim 1, wherein the enclosure is permeable to at least one of air or water.

16. The heat dissipation device of claim 1, wherein the interior compartment of the vehicle is at least one of a passenger compartment or a cargo compartment of the vehicle.

17. The heat dissipation device of claim 1, further comprising the at least one device, wherein the at least one device is at least partially disposed within the enclosure.

18. The heat dissipation device of claim 17, wherein the at least one device comprises at least one electrical interface, and
wherein the enclosure comprises at least one opening aligned with the at least one electrical interface.

19. A heat dissipation device comprising:
a heat sink;
an enclosure disposed on a first side of the heat sink and thermally coupled to the heat sink, wherein the enclosure is configured to receive at least one device comprising electronic circuitry;
a fan disposed on a second side of the heat sink opposite the first side;
a flange extending along a periphery of at least one of the enclosure or the heat sink; and
at least one air duct;
wherein the heat dissipation device is configured for insertion into an aperture of a wall of an interior compartment of a vehicle, such that:
the flange is positioned against the wall,
at least a portion of the enclosure is positioned within the interior compartment of the vehicle, and
at least a portion of the heat sink and the fan are positioned along an exterior of the vehicle, and
wherein the heat dissipation device is configured to extract heat from the electronic circuitry using the heat sink and dissipate heat from the heat sink to the exterior of the vehicle,
wherein the at least one air duct is configured to direct air from the exterior of the vehicle towards at least one of the fan or the heat sink, and
wherein the at least one air duct comprises a first air duct, wherein the first air duct comprises:
a first opening positioned proximal to at least one of the fan or the heat sink, and
a second opening in fluid communication with the first opening and positioned opposite the first opening,
wherein a cross-sectional area of the first opening is smaller than a cross-sectional area of the second opening.

20. A heat dissipation device comprising:
a heat sink;
an enclosure disposed on a first side of the heat sink and thermally coupled to the heat sink, wherein the enclosure is configured to receive at least one device comprising electronic circuitry;
a fan disposed on a second side of the heat sink opposite the first side;
a flange extending along a periphery of at least one of the enclosure or the heat sink; and
at least one air duct;
wherein the heat dissipation device is configured for insertion into an aperture of a wall of an interior compartment of a vehicle, such that:
the flange is positioned against the wall,
at least a portion of the enclosure is positioned within the interior compartment of the vehicle, and
at least a portion of the heat sink and the fan are positioned along an exterior of the vehicle, and
wherein the heat dissipation device is configured to extract heat from the electronic circuitry using the heat sink and dissipate heat from the heat sink to the exterior of the vehicle,
wherein the at least one air duct is configured to direct air from the exterior of the vehicle towards at least one of the fan or the heat sink, and
wherein the at least one air duct comprises a first air duct, wherein the first air duct comprises:
a first opening positioned proximal to at least one of the fan or the heat sink, and
a second opening in fluid communication with the first opening and positioned opposite the first opening,
wherein a cross-sectional area of the first opening is larger than a cross-sectional area of the second opening.

21. A heat dissipation device comprising:
a heat sink;
an enclosure disposed on a first side of the heat sink and thermally coupled to the heat sink, wherein the enclosure is configured to receive at least one device comprising electronic circuitry:
a fan disposed on a second side of the heat sink opposite the first side;
a flange extending along a periphery of at least one of the enclosure or the heat sink;
at least one air duct; and at least one adjustable vent;
wherein the heat dissipation device is configured for insertion into an aperture of a wall of an interior compartment of a vehicle, such that:
the flange is positioned against the wall,
at least a portion of the enclosure is positioned within the interior compartment of the vehicle, and
at least a portion of the heat sink and the fan are positioned along an exterior of the vehicle, and
wherein the heat dissipation device is configured to extract heat from the electronic circuitry using the heat sink and dissipate heat from the heat sink to the exterior of the vehicle, wherein the at least one air duct is configured to direct air from the exterior of the vehicle towards at least one of the fan or the heat sink, and
wherein the at least one adjustable vent is configured to regulate a flow of air through the at least one air duct.

22. The heat dissipation device of claim 21, wherein the at least one adjustable vent is configured to selectively open based on an air pressure within the at least on air duct.

23. A vehicle comprising:
an interior compartment, wherein the interior compartment is at least partially defined by a wall;
a heat dissipation device inserted in an aperture of the wall, the heat dissipation device comprising:
a heat sink,
an enclosure disposed on a first side of the heat sink and thermally coupled to the heat sink, wherein the enclosure is configured to receive at least one device comprising electronic circuitry,
a fan disposed on a second side of the heat sink opposite the first side,
control circuitry configured to regulate a rotation speed of the fan, and
a flange extending along a periphery of at least one of the enclosure or the heat sink,
wherein the flange is positioned against the wall,
wherein the enclosure is positioned at least partially within the interior compartment of the vehicle, and
wherein the heat sink and the fan are positioned at least partially along an exterior of the vehicle, and
wherein the heat dissipation device is configured to extract heat from the electronic circuitry using the heat sink and dissipate heat from the heat sink to an exterior environment,
wherein the control circuitry is configured to regulate the rotation speed of the fan based on a velocity of the vehicle, and
wherein regulating the rotation speed of the fan comprises:
determining that the velocity of the vehicle is a first velocity, and
in response to determining that the velocity of the vehicle is the first velocity, causing the fan to operate according to a first rotation speed.

* * * * *